US012588447B2

(12) United States Patent
Katsunuma

(10) Patent No.: US 12,588,447 B2
(45) Date of Patent: Mar. 24, 2026

(54) ETCHING METHOD AND PLASMA PROCESSING APPARATUS

(71) Applicant: Tokyo Electron Limited, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 252 days.

(21) Appl. No.: 18/212,747

(22) Filed: Jun. 22, 2023

(65) Prior Publication Data

US 2023/0420263 A1     Dec. 28, 2023

(51) Int. Cl.
| | |
|---|---|
| *H01L 21/311* | (2006.01) |
| *H01J 37/32* | (2006.01) |
| *H01L 21/306* | (2006.01) |
| *H01L 21/3065* | (2006.01) |
| *H01L 21/308* | (2006.01) |

(52) U.S. Cl.
CPC .. *H01L 21/31116* (2013.01); *H01J 37/32449* (2013.01); *H01L 21/30604* (2013.01); *H01L 21/3065* (2013.01); *H01L 21/308* (2013.01); *H01L 21/31111* (2013.01); *H01L 21/31144* (2013.01); *H01J 2237/334* (2013.01)

(58) Field of Classification Search
CPC ......... H01L 21/31116; H01L 21/30604; H01L 21/3065; H01L 21/308; H01L 21/31111; H01L 21/31144; H01L 21/31122; H01L 21/67017; H01L 21/67069; H01L 21/0337; H01L 21/0332; H01L 21/32134; H01L 21/32137; H01J 37/32449; H01J 2237/334; H01J 37/32908; C23C 16/14; C23C 16/50; C23C 16/52; C23C 16/56
USPC ......................................................... 438/190
See application file for complete search history.

(56) References Cited

U.S. PATENT DOCUMENTS

| | | | | |
|---|---|---|---|---|
| 5,234,864 A * | 8/1993 | Kim | .................. | H01L 21/76804 |
| | | | | 257/E21.252 |
| 5,975,912 A * | 11/1999 | Hillman | .................... | C23C 8/02 |
| | | | | 438/597 |
| 9,941,135 B2 * | 4/2018 | Park | ........................ | C23C 16/56 |
| 2005/0026361 A1 * | 2/2005 | Graettinger | .......... | H10B 12/033 |
| | | | | 257/E21.648 |
| 2011/0151670 A1 | 6/2011 | Lee et al. | | |
| 2013/0122703 A1 * | 5/2013 | Ku | .................... | H01L 21/31144 |
| | | | | 257/E21.585 |
| 2017/0076945 A1 | 3/2017 | Hudson et al. | | |
| 2018/0090373 A1 * | 3/2018 | Sharangpani | .......... | H10B 43/10 |

(Continued)

FOREIGN PATENT DOCUMENTS

| | | |
|---|---|---|
| JP | H09-050984 A | 2/1997 |
| JP | 2015-076550 A | 4/2015 |
| JP | 2022-519703 A | 3/2022 |

*Primary Examiner* — Duy Vu N Deo
(74) *Attorney, Agent, or Firm* — XSENSUS LLP

(57) ABSTRACT

An etching method includes: (a) providing a substrate including an etching target film and a mask on the etching target film; (b) after (a), forming a metal-containing deposit on the mask by a first plasma generated from a first processing gas including a metal-containing gas and a hydrogen-containing gas; (c) after (b), deforming or modifying the metal-containing deposit by a second plasma generated from a second processing gas different from the first processing gas; and (d) after (c), etching the etching target film.

18 Claims, 20 Drawing Sheets

(56)                    References Cited

U.S. PATENT DOCUMENTS

| | | | |
|---|---|---|---|
| 2022/0102267 A1* | 3/2022 | Chen | H01L 23/5286 |
| 2023/0155002 A1* | 5/2023 | Chiu | H10D 64/018 |
| | | | 257/347 |

\* cited by examiner

PR1

PR42

PR0

ETCHING METHOD AND PLASMA PROCESSING APPARATUS

CROSS-REFERENCE TO RELATED APPLICATION

This application is based on and claims priority from Japanese Patent Application No. 2022-100139, filed on Jun. 22, 2022, with the Japan Patent Office, the disclosure of which is incorporated herein in its entirety by reference.

TECHNICAL FIELD

The present disclosure relates to an etching method and a plasma processing apparatus.

BACKGROUND

Japanese Patent Laid-Open Publication No. H09-050984 discloses a method of etching an insulating film by using plasma. The method performs etching while forming a conductive layer on the surface of the insulating film during the etching. For the etching, plasma generated from a mixed gas of $WF_6$ and $C_4F_8$ is used.

SUMMARY

According to an embodiment of the present disclosure, an etching method includes: (a) providing a substrate including an etching target film and a mask on the etching target film; (b) after (a), forming a metal-containing deposit on the mask by a first plasma generated from a first processing gas including a metal-containing gas and a hydrogen-containing gas; (c) after (b), deforming or modifying the metal-containing deposit by a second plasma generated from a second processing gas different from the first processing gas; and (d) after (c), etching the etching target film.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
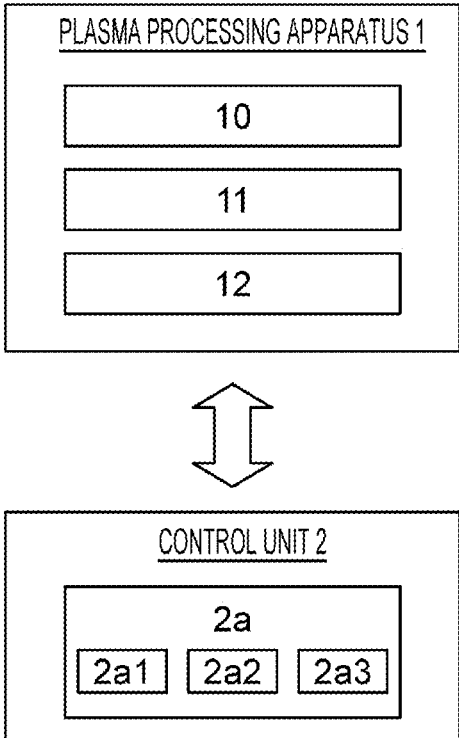
FIG. 1 is a view schematically illustrating a plasma processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various Embodiments 1 to 19 will be described below.

Embodiment 1

An etching method including:

(a) providing a substrate including an etching target film and a mask on the etching target film;

(b) after (a), forming a metal-containing deposit on the mask by a first plasma generated from a first processing gas including a metal-containing gas and a hydrogen-containing gas;

(c) after (b), deforming or modifying the metal-containing deposit by a second plasma generated from a second processing gas different from the first processing gas; and (d) after (c), etching the etching target film.

Embodiment 2

The etching method according to Embodiment 1, wherein (d) includes etching the etching target film by a third plasma generated from a third processing gas different from the first and second processing gases.

3

Embodiment 3

The etching method according to Embodiment 1 or 2, wherein the hydrogen-containing gas includes at least one of hydrogen gas, hydrocarbon gas, and hydrofluorocarbon gas.

Embodiment 4

The etching method according to any one of Embodiments 1 to 3, wherein the first processing gas includes a noble gas.

Embodiment 5

The etching method according to any one of Embodiments 1 to 4, wherein in (b), a temperature of a substrate support that supports the substrate is 0° C. or higher and 250° C. or lower.

Embodiment 6

The etching method according to any one of Embodiments 1 to 5, wherein a flow rate ratio of the hydrogen-containing gas over the metal-containing gas is 2 or more and 40 or less.

Embodiment 7

The etching method according to any one of Embodiments 1 to 6, wherein the second processing gas includes at least one of fluorocarbon gas, hydrofluorocarbon gas, and a halogen-containing gas.

Embodiment 8

The etching method according to Embodiment 7, wherein the second processing gas includes at least one of $C_4F_6$ gas, $CH_3F$ gas, and $CHF_3$ gas.

Embodiment 9

The etching method according to Embodiment 7 or 8, wherein the second processing gas includes a halogen-containing gas that contains silicon.

Embodiment 10

The etching method according to any one of Embodiments 7 to 9, wherein the second processing gas includes $NF_3$ gas.

Embodiment 11

The etching method according to any one of Embodiments 1 to 10, wherein in (c), a bias power is supplied to a substrate support that supports the substrate.

Embodiment 12

The etching method according to any one of Embodiments 1 to 11, wherein the mask includes at least one of a silicon-containing film, a carbon-containing film, and a metal-containing film.

4

Embodiment 13

The etching method according to any one of Embodiments 1 to 12, wherein an opening is formed in the mask, and an aspect ratio of the opening is 1 or more and 100 or less.

Embodiment 14

The etching method according to any one of Embodiments 1 to 13, wherein the etching target film includes at least one of a silicon-containing film and a carbon-containing film.

Embodiment 15

The etching method according to Embodiment 14, wherein the etching target film includes at least one of a silicon-containing film that contains boron, a silicon film, a silicon oxide film, and a silicon nitride film.

Embodiment 16

The etching method according to any one of Embodiments 1 to 15, wherein (d) includes etching the etching target film by at least one of chemical etching that uses a gas without using a plasma, and wet etching.

Embodiment 17

The etching method according to any one of Embodiments 1 to 16, wherein the metal-containing gas includes at least one of tungsten, molybdenum, and zirconium.

Embodiment 18

An etching method including:
(a) providing a substrate having an etching target film including a silicon-containing film, and a mask on the etching target film;
(b) after (a), forming a tungsten-containing deposit on the mask by a first plasma generated from a first processing gas including tungsten hexafluoride gas and a hydrogen-containing gas, the hydrogen-containing gas including at least one of hydrogen gas, hydrocarbon gas, and hydrofluorocarbon gas;
(c) after (b), deforming or modifying the tungsten-containing deposit by a second plasma generated from a second processing gas different from the first processing gas, the second processing gas including at least one of fluorocarbon gas, hydrofluorocarbon gas, and a halogen-containing gas; and
(d) after (c), etching the etching target film by a third plasma generated from a third processing gas different from the first and second processing gases.

Embodiment 19

A plasma processing apparatus including:
a chamber; and
a substrate support that supports a substrate in the chamber;
a gas supply that supplies a processing gas into the chamber;
a plasma generator that generates plasma in the chamber; and a controller, wherein the controller is configured to control the gas supply and the plasma generator to perform a process including providing the substrate including an etching target film and a mask on the etching target film, forming a metal-containing deposit on the mask by a first plasma generated from a first processing gas including a metal-containing gas and a hydrogen-containing gas, after forming the metal-containing deposit, deforming or modifying the metal-containing deposit by a second plasma generated from a second processing gas different from the first processing gas, and after deforming or modifying the metal-containing deposit, etching the etching target film.

Hereinafter, the various embodiments will be described in detail with reference to the drawings. In the respective drawings, the same or corresponding components will be denoted by the same reference numerals.

FIG. 1 is a view illustrating an example of a configuration of a plasma processing system. In an embodiment, the plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generation unit 12. The plasma processing chamber 10 includes a plasma processing space. The plasma processing chamber 10 further includes at least one gas supply port for supplying at least one processing gas into the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed inside the plasma processing space, and has a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave plasma (HWP), or surface wave plasma (SWP). In addition, various types of plasma generation units may be used, such as an alternating current (AC) plasma generation unit and a direct current (DC) plasma generation unit. In an embodiment, an AC signal (an AC power) used in the AC plasma generation unit has a frequency in the range of 100 kHz to 10 GHz. Accordingly, the AC signal includes a radio frequency (RF) signal and a microwave signal. In an embodiment, the RF signal has a frequency in the range of 100 kHz to 150 MHz.

The control unit 2 processes computer-executable commands that cause the plasma processing apparatus 1 to perform various processes described herein below. The control unit 2 may be configured to control each component of the plasma processing apparatus 1 to perform the various processes described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read programs from the storage unit 2a2 and execute the read programs, thereby performing various control operations. The programs may be stored in advance in the storage unit 2a2, or may be acquired from a medium when necessary. The acquired programs are stored in the storage unit 2a2, and read from the storage unit 2a2 by the processing unit 2a1 to be executed. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
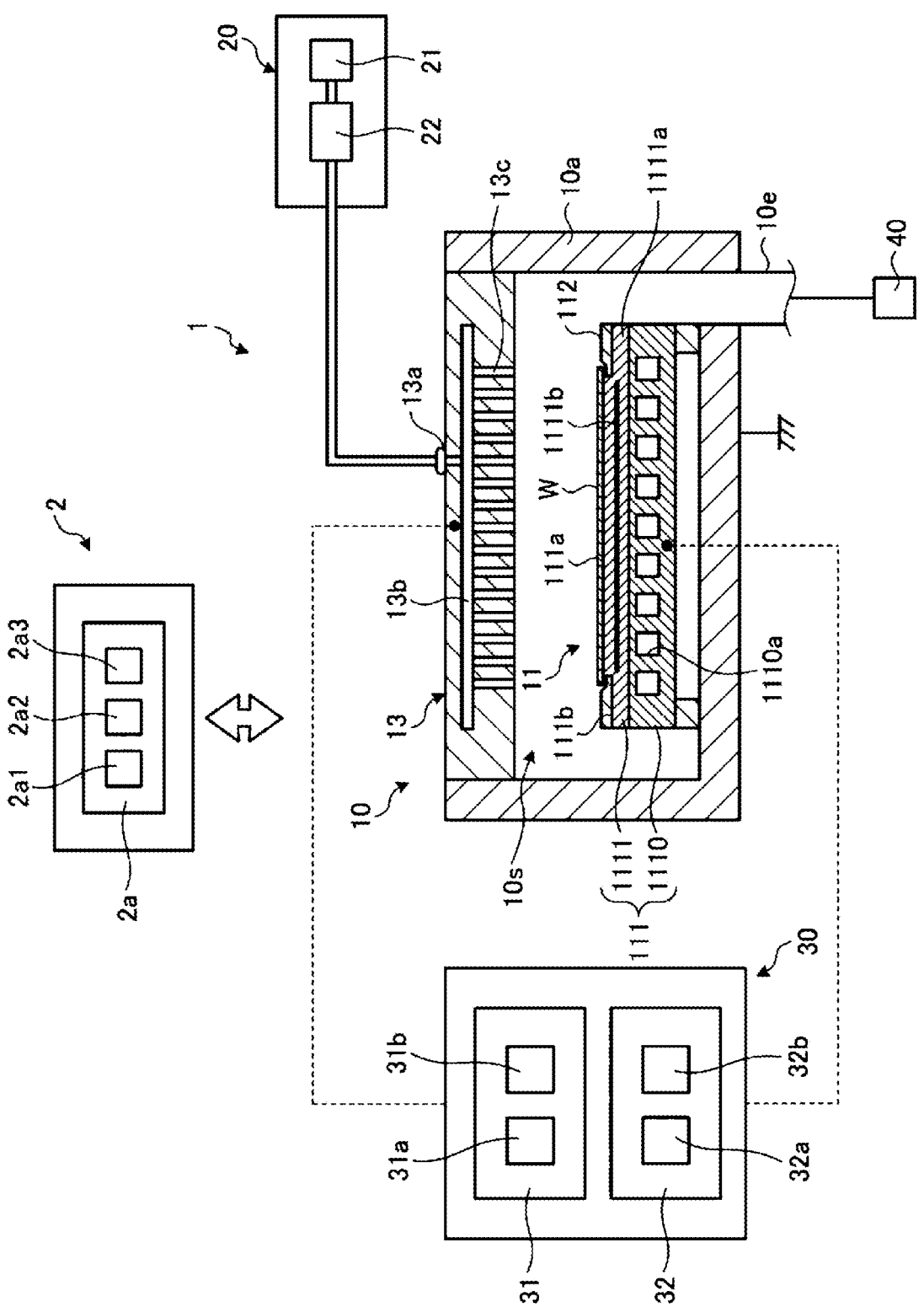
FIG. 2 is a view schematically illustrating a plasma processing apparatus according to an embodiment.

Hereinafter, descriptions will be made on an example of a configuration of a capacitively coupled plasma processing apparatus, which is an example of the plasma processing apparatus 1. FIG. 2 is a view illustrating an example of the configuration of the capacitively coupled plasma processing apparatus.

The capacitively coupled plasma processing apparatus 1 includes the plasma processing chamber 10, the gas supply unit 20, a power supply 30, and an exhaust system 40. The plasma processing apparatus 1 further includes the substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the side wall 10a of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in plan view. The substrate W is disposed on the central region 111a of the main body 111, and the ring assembly 112 is disposed on the annular region 111b of the main body 111 to surround the substrate W disposed on the central region 111a of the main body 111. Accordingly, the central region 111a is also referred to as a substrate support surface for supporting the substrate W thereon, and the annular region 111b is also referred to as a ring support surface for supporting the ring assembly 112 thereon.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode may be disposed inside the ceramic member 1111*a*, to be coupled to a radio-frequency (RF) power supply 31 and/or a direct current (DC) power supply 32, which will be described later. In this case, the at least one RF/DC electrode functions as a lower electrode. When a bias RF signal and/or a DC signal to be described later is supplied to the at least one RF/DC electrode, the RF/DC electrode is also referred to as a bias electrode. Further, the conductive member of the base 1110 and the at least one RF/DC electrode may function as a plurality of lower electrodes. The electrostatic electrode 1111*b* may function as a lower electrode. Thus, the substrate support 11 includes at least one lower electrode.

The ring assembly 112 includes one or more annular members. In an embodiment, the one or more annular members include one or more edge rings and at least one cover ring. The edge ring is made of a conductive material or an insulating material, and the cover ring is made of an insulating material.

The substrate support 11 may include a temperature adjustment module configured to adjust at least one of the electrostatic chuck 1111, the ring assembly 112, and the substrate to a target temperature. The temperature adjustment module may include a heater, a heat transfer medium, a flow path 1110*a*, or a combination thereof. A heat transfer fluid such as brine and a gas flows in the flow path 1110*a*. In an embodiment, the flow path 1110*a* is formed inside the base 1110, and one or a plurality of heaters is disposed inside the ceramic member 1111*a* of the electrostatic chuck 1111. The substrate support 11 may include a heat transfer gas supply unit configured to supply a heat transfer gas to the gap between the back surface of the substrate W and the central region 111*a*.

The shower head 13 is configured to introduce at least one processing gas from the gas supply unit 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introduction unit may include one or a plurality of side gas injectors (SGI) attached to one or a plurality of openings formed in the side wall 10*a*, in addition to the shower head 13.

The gas supply unit 20 may include at least one gas source 21 and at least one flow rate controller 22. In an embodiment, the gas supply unit 20 is configured to supply at least one processing gas from its corresponding gas source 21 to the shower head 13 via its corresponding flow rate controller 22. The flow rate controller 22 may include, for example, a mass flow controller or a pressure-controlled flow rate controller. The gas supply unit 20 may further include at least one flow rate modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is formed from at least one processing gas supplied into the plasma processing space 10*s*. Accordingly, the RF power supply 31 may function as at least a portion of the plasma generation unit 12. By supplying a bias RF signal to at least one lower electrode, a bias potential is generated in the substrate W so that ion components in the formed plasma may be attracted to the substrate W.

In an embodiment, the RF power supply 31 includes a first RF generation unit 31*a* and a second RF generation unit 31*b*. The first RF generation unit 31*a* is coupled to at least one lower electrode and/or at least one upper electrode via at least one impedance matching circuit, and configured to generate a source RF signal (source RF power) for generating plasma. In an embodiment, the source RF signal has a frequency in the range of 10 MHz to 150 MHz. In an embodiment, the first RF generation unit 31*a* may be configured to generate a plurality of source RF signals having different frequencies. One or a plurality of generated source RF signals is supplied to at least one lower electrode and/or at least one upper electrode.

The second RF generation unit 31*b* is coupled to at least one lower electrode via at least one impedance matching circuit, and configured to generate a bias RF signal (bias RF power). The frequency of the bias RF signal may be the same as or different from the frequency of the source RF signal. In an embodiment, the bias RF signal has a frequency lower than that of the source RF signal. In an embodiment, the bias RF signal has a frequency in the range of 100 kHz to 60 MHz. In an embodiment, the second RF generation unit 31*b* may be configured to generate a plurality of bias RF signals having different frequencies. One or a plurality of generated bias RF signals is supplied to at least one lower electrode. In various embodiments, at least one of the source RF signal and the bias RF signal may be pulsed.

The power supply 30 may further include a DC power supply 32 coupled to the plasma processing chamber 10. The DC power supply 32 includes a first DC generation unit 32*a* and a second DC generation unit 32*b*. In an embodiment, the first DC generation unit 32*a* is connected to at least one lower electrode, and configured to generate a first DC signal. The generated first DC signal is applied to at least one lower electrode. In an embodiment, the second DC generation unit 32*b* is connected to at least one upper electrode, and configured to generate a second DC signal. The generated second DC signal is applied to at least one upper electrode.

In various embodiments, the first and second DC signals may be pulsed. In this case, a sequence of voltage pulses is applied to at least one lower electrode and/or at least one upper electrode. The voltage pulses may have rectangular, trapezoidal, or triangular pulse waveforms, or combined pulse waveforms thereof. In an embodiment, a waveform generation unit is connected between the first DC generation unit 32*a* and at least one lower electrode, to generate a sequence of voltage pulses from a DC signal. Thus, the first DC generation unit 32*a* and the waveform generation unit make up a voltage pulse generation unit. When the second DC generation unit 32*b* and the waveform generation unit make up the voltage pulse generation unit, the voltage pulse generation unit is connected to at least one upper electrode. The voltage pulse may have a positive polarity or a negative polarity. The sequence of voltage pulses may include one or a plurality of positive voltage pulses and one or a plurality of negative voltage pulses in one cycle. The first and second DC generation units 32*a* and 32*b* may be provided in addition to the RF power supply 31, and the first DC generation unit 32*a* may be provided in place of the second RF generation unit 31*b*.

The exhaust system 40 may be connected to a gas discharge port 10*e* formed at, for example, the bottom of the plasma processing chamber 10. The exhaust system 40 may include a pressure regulation valve and a vacuum pump. The pressure in the plasma processing space 10s is regulated by the pressure regulation valve. The vacuum pump may include a turbo molecular pump, a dry pump, or a combination thereof.

Figure 3:
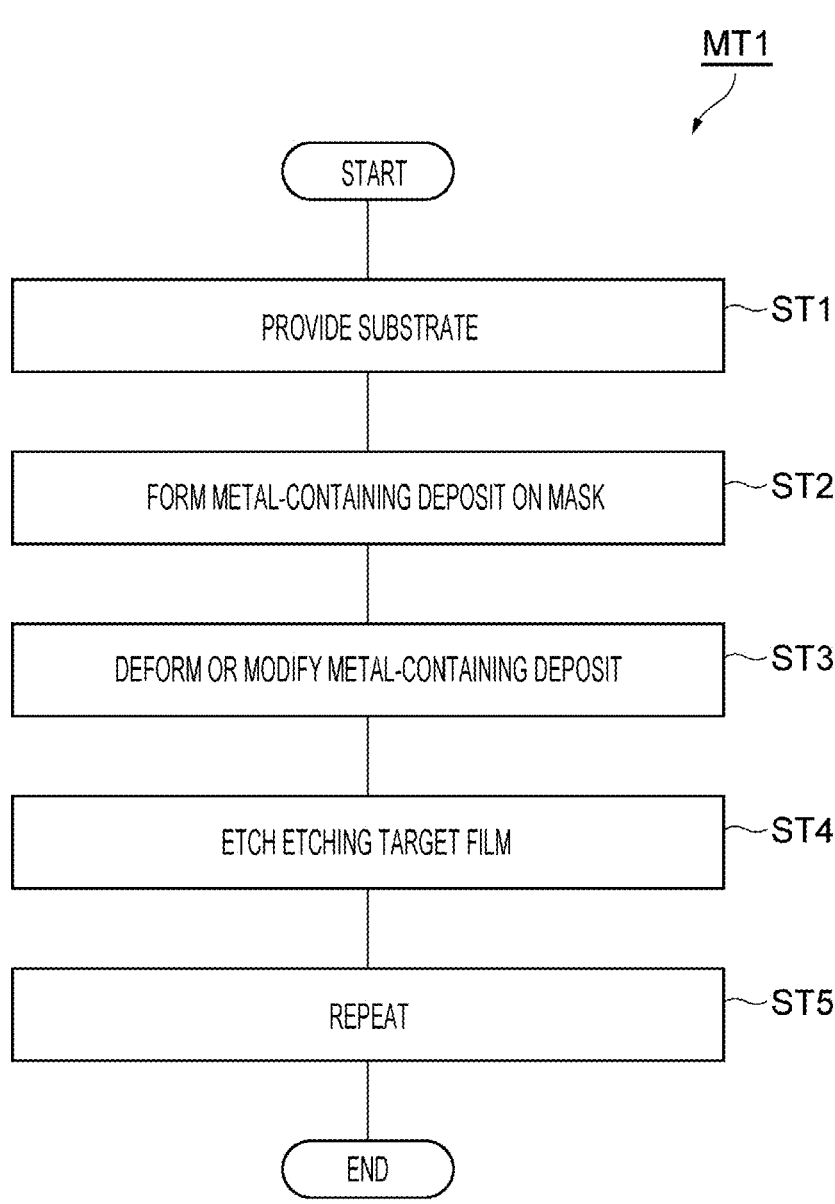
FIG. 3 is a flow chart of an etching method according to an embodiment.

FIG. 3 is a flow chart of an etching method according to an embodiment. The etching method illustrated in FIG. 3 (hereinafter, referred to as a "method MT1") may be executed by the plasma processing apparatus 1 of the embodiment described above. The method MT1 may be applied to the substrate W.

Figure 4:
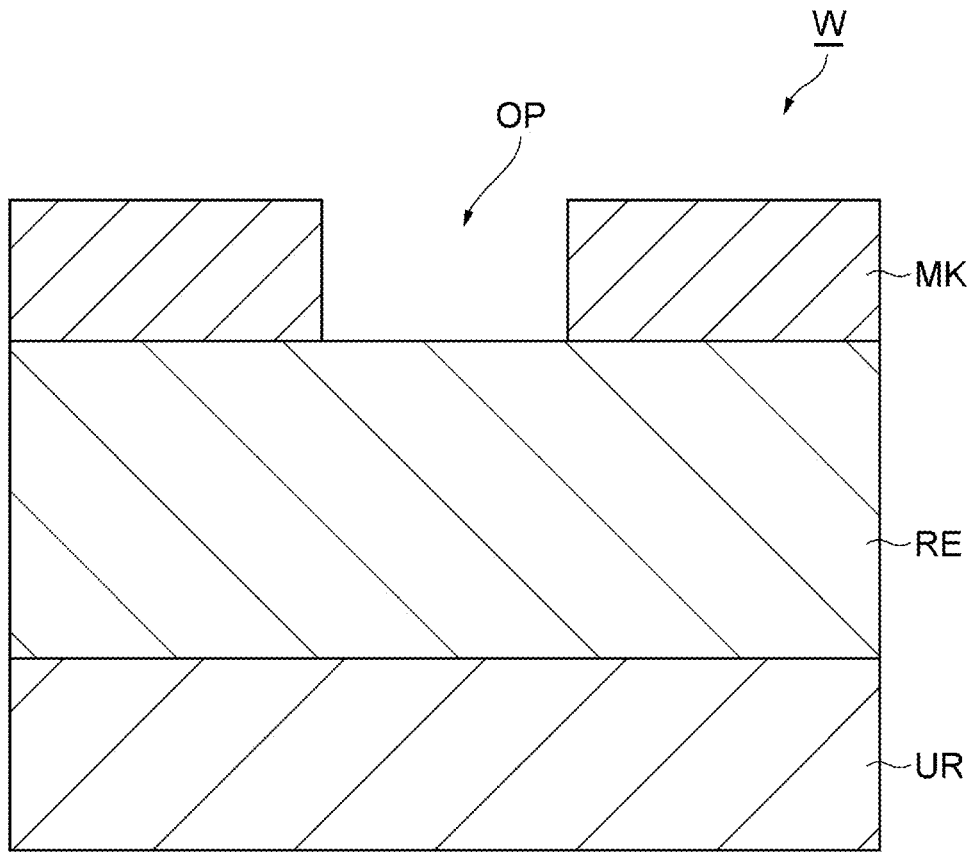
FIG. 4 is a cross-sectional view of an example of a substrate, to which the method of FIG. 3 is applicable.

FIG. 4 is a plan view illustrating an example of a substrate, to which the method of FIG. 3 may be applied. As illustrated in FIG. 4, in an embodiment, the substrate W includes an etching target film RE and a mask MK on the etching target film RE. The etching target film RE may be formed on an underlying film UR. The mask MK may have at least one opening OP. The aspect ratio of the opening OP may be 1 or more and 100 or less.

The etching target film RE may include at least one of a silicon-containing film and a carbon-containing film. The silicon-containing film may include at least one of a silicon-containing film that contains boron, a silicon film, a silicon oxide film, and a silicon nitride film. The silicon-containing film may be a multilayer film, in which a silicon oxide film and a silicon nitride film are stacked alternately. The carbon-containing film may be an amorphous carbon film. The etching target film RE may be, for example, a film for a memory device such as DRAM or 3D-NAND.

The mask MK may include at least one of a silicon-containing film, a carbon-containing film, and a metal-containing film. The silicon-containing film may include at least one of a polysilicon film, a silicon oxide film, a silicon nitride film, and a silicon oxynitride film. The carbon-containing film may include at least one of an amorphous carbon film and a photoresist film. The metal-containing film may include at least one of titanium nitride ($TiN_x$) film, tungsten silicide ($W_xSi_y$) film, tungsten silicon nitride ($W_xSi_yN_z$) film, tungsten silicon boron ($W_xSi_yB_z$) film, and tungsten silicon carbon ($W_xSi_yC_z$) film. Each of the composition ratios "x," "y," and "z" may be a real number larger than 0.

The underlying film UR may include a material different from the etching target film RE. The underlying film UR may include at least one of a silicon-containing film, a carbon-containing film, and a metal-containing film.

Hereinafter, the method MT1 will be described with reference to FIGS. 3 to 8, with an example where the method MT1 is applied to the substrate W using the plasma processing apparatus 1 of the embodiment described above. FIGS. 5 to 8 are each a cross-sectional view illustrating a step of the etching method according to an embodiment. When the plasma processing apparatus 1 is used, the method MT1 may be executed in the plasma processing apparatus 1 in the manner that the control unit 2 controls each component of the plasma processing apparatus 1. In the method MT1, as illustrated in FIG. 2, the substrate W on the substrate support 11 disposed inside the plasma processing chamber 10 is processed.

As illustrated in FIG. 3, the method MT1 may include steps ST1 to ST5. Steps ST1 to ST5 may be executed in sequence. The method MT1 may not include step ST5.
(Step ST1)

In step ST1, the substrate W illustrated in FIG. 4 is provided. The substrate W may be provided inside the plasma processing chamber 10. The substrate W may be supported by the substrate support 11 in the plasma processing chamber 10. The underlying film UR may be disposed between the substrate support 11 and the etching target film RE.
(Step ST2)

Figure 5:
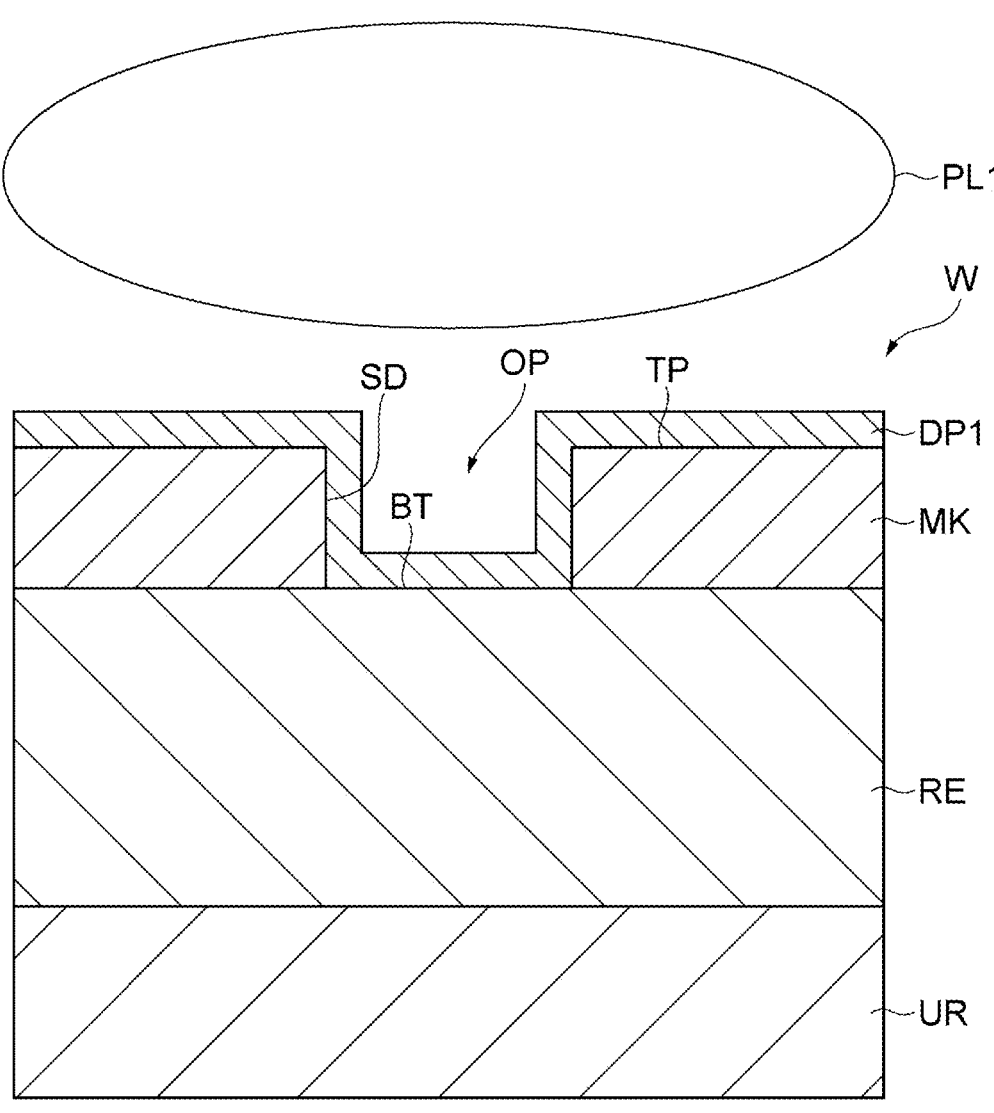
FIG. 5 is a cross-sectional view illustrating a step of an etching method according to an embodiment.

In step ST2, as illustrated in FIG. 5, a metal-containing deposit DP1 is formed on the mask MK, by a first plasma PL1 generated from a first processing gas. The metal-containing deposit DP1 may be formed on the top surface TP of the mask MK. The metal-containing deposit DP1 may be formed on the side wall SD and the bottom BT of the opening OP of the mask MK. The thickness of the metal-containing deposit DP1 on the top surface TP of the mask MK may be larger than the thickness of the metal-containing deposit DP1 on the side wall SD of the opening OP of the mask MK. The metal-containing deposit DP1 may include at least one of a tungsten-containing deposit, a molybdenum-containing deposit, and a zirconium-containing deposit. The metal-containing deposit DP1 may contain fluorine. The metal-containing deposit DP1 may contain W—F bonds.

The first processing gas includes a metal-containing gas and a hydrogen-containing gas. The metal-containing gas may include at least one of a tungsten-containing gas, a molybdenum-containing gas, and a zirconium-containing gas. The tungsten-containing gas may include at least one of tungsten hexafluoride ($WF_6$) gas, tungsten hexabromide ($WBr_6$) gas, tungsten hexachloride ($WCl_6$) gas, $WF_5Cl$ gas, and hexacarbonyl tungsten ($W(CO)_6$) gas. The molybdenum-containing gas may include molybdenum hexafluoride ($MoF_6$) gas. The zirconium-containing gas may include zirconium fluoride gas. The hydrogen-containing gas may include at least one of hydrogen ($H_2$) gas, hydrocarbon gas, and hydrofluorocarbon gas. The hydrogen-containing gas may include at least one of hydrogen gas, $CH_4$ gas, $CH_3F$ gas, $C_2H_2$ gas, $C_3H_6$ gas, and $C_2H_4$ gas. The first processing gas may include a noble gas. Examples of the noble gas include argon.

In step ST2, the temperature of the substrate support 11 for supporting the substrate W may be 0° C. or higher and 250° C. or lower, or 10° C. or higher and 120° C. or lower.

The flow rate ratio of the hydrogen-containing gas over the metal-containing gas may be 2 or more and 40 or less, or 2 or more to 20 or less.

Step ST2 may be performed as follows. First, the gas supply unit 20 supplies the first processing gas into the plasma processing chamber 10. Next, the plasma generation unit 12 generates the first plasma PL1 from the first processing gas in the plasma processing chamber 10. The control unit 2 controls the gas supply unit 20 and the plasma generation unit 12 to form the metal-containing deposit DP1 on the mask MK by the first plasma PL1.
(Step ST3)

Figure 6:
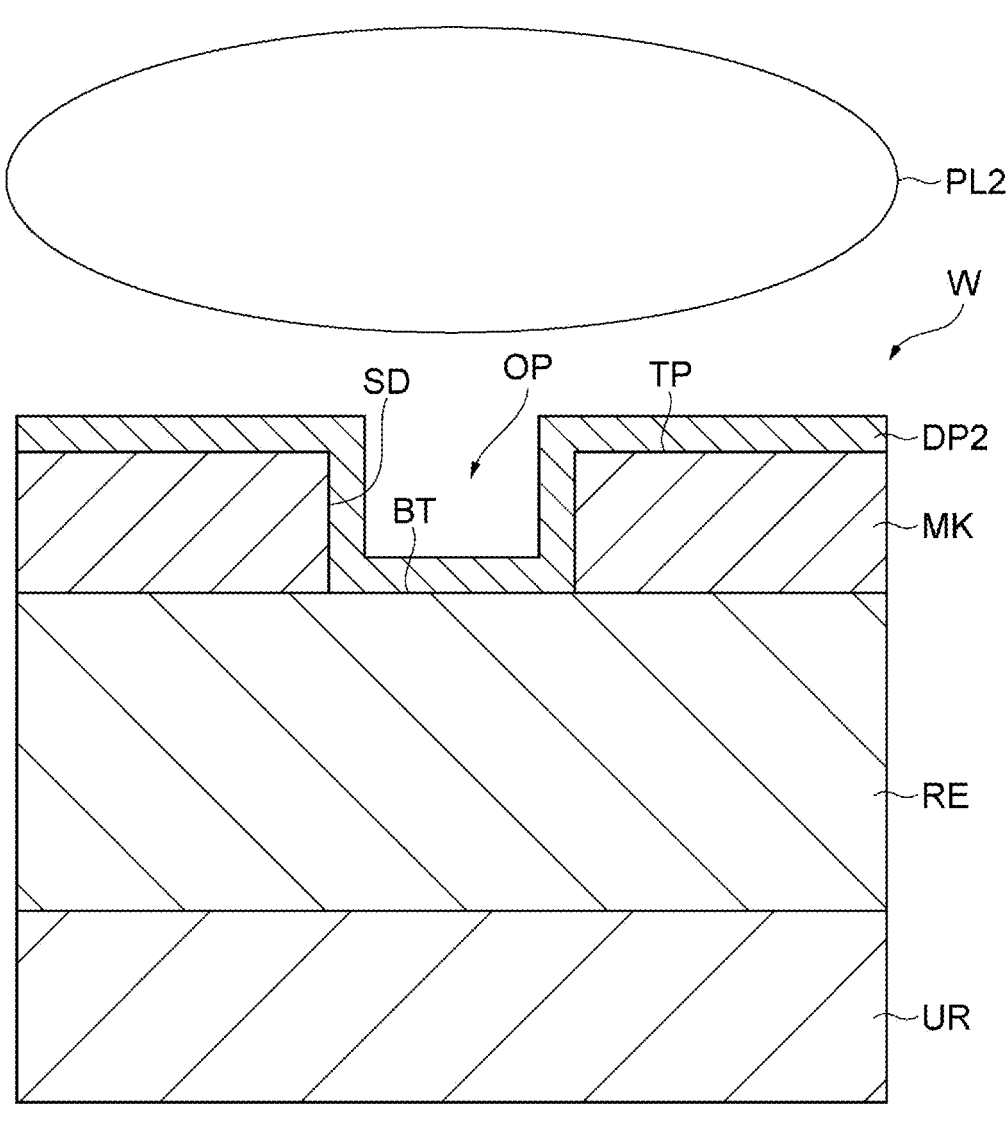
FIG. 6 is a cross-sectional view illustrating a step of an etching method according to an embodiment.

In step ST3, as illustrated in FIG. 6, the metal-containing deposit DP1 is deformed or modified by a second plasma PL2 generated from a second processing gas. As a result, a deformed or modified metal-containing deposit DP2 is obtained. The deformation indicates altering the shape of the entire metal-containing deposit or a portion of the metal-containing deposit, in particular, altering the shape (profile) of at least the surface of the metal-containing deposit. The modification indicates altering the chemical composition of the entire metal-containing deposit or a portion of the metal-containing deposit, in particular, altering the chemical composition of at least the surface of the metal-containing deposit. When the metal-containing deposit DP1 is deformed, the surface profile of the metal-containing deposit DP2 differs from the surface profile of the metal-containing deposit DP1. The material of the surface of the metal-containing deposit DP2 may be the same as the material of the surface of the metal-containing deposit DP1. When the metal-containing deposit DP1 is modified, the material of the surface of the metal-containing deposit DP2 differs from the material of the surface of the metal-containing deposit DP1. The active species in the second plasma PL2 react with the material of the surface of the metal-containing deposit DP1, so that the material of the surface of the metal-containing deposit DP2 is obtained. The vicinity of the surface of the metal-containing deposit DP1 may be modified. The metal-containing deposit DP1 may contain tungsten, and the second processing gas may include a halogen-containing gas that contains silicon. In this case, a metal-containing deposit DP2 that contains tungsten silicide is obtained. The metal-containing deposit DP1 may contain tungsten, and the second processing gas may include at least one of fluorocarbon gas and hydrofluorocarbon gas. In this case, a metal-containing deposit DP2 that contains tungsten carbide is obtained. The metal-containing deposit DP1 may contain tungsten, and the second processing gas may include an oxygen-containing gas. In this case, a metal-containing deposit DP2 that contains tungsten oxide is obtained. The surface profile of the metal-containing deposit DP2 may be the same as or different from the surface profile of the metal-containing deposit DP1.

The second processing gas is different from the first processing gas. Between steps ST2 and ST3, the supply of the first processing gas may be stopped, and the supply of the second processing gas may be started. The second processing gas may not contain tungsten. The second processing gas may contain at least one of carbon and halogen. The second processing gas may include at least one of fluorocarbon gas, hydrofluorocarbon gas, and halogen-containing gas. The second processing gas may include at least one of $C_4F_6$ gas, $CH_3F$ gas, and $CHF_3$ gas. The second processing gas may include a halogen-containing gas that contains silicon. The second processing gas may include a chlorine-containing gas that contains silicon, or a fluorine-containing gas that contains silicon. The second processing gas may include at least one of $SiCl_4$ gas, $Si_2Cl_6$ gas, and $SiF_4$ gas. The second processing gas may include nitrogen trifluoride ($NF_3$) gas. The second processing gas may include a chlorine-containing gas. The second processing gas may include chlorine ($Cl_2$) gas. The second processing gas may include at least one of an inert gas and an oxygen-containing gas. Examples of the inert gas include a noble gas and nitrogen gas. Examples of the oxygen-containing gas include oxygen gas and carbon monoxide gas.

In step ST3, a bias power may or may not be supplied to the substrate support 11 that supports the substrate W. The processing time of step ST3 may be shorter than the processing time of step ST2. The processing time of step ST3 may be 10 seconds or longer and 200 seconds or shorter. In step ST3, the temperature of the substrate support 11 for supporting the substrate W may be 10° C. or higher and 120° C. or lower, or 30° C. or higher and 80° C. or lower.

Step ST3 may be performed as follows. First, the gas supply unit 20 supplies the second processing gas into the plasma processing chamber 10. Next, the plasma generation unit 12 generates the second plasma PL2 from the second processing gas in the plasma processing chamber 10. The control unit 2 controls the gas supply unit 20 and the plasma generation unit 12, to deform or modify the metal-containing deposit DP1 by the second plasma PL2.

Step ST3 may be performed in the same plasma processing chamber 10 as the plasma processing chamber 10 of step ST2, or in a different plasma processing chamber from the plasma processing chamber 10 of step ST2.

(Step ST4)

In step ST4, the etching target film RE is etched. A recess RS may be formed in the etching target film RE. The recess RS has a shape corresponding to the opening OP of the mask MK. The bottom of the recess RS may or may not reach the underlying film UR.

Figure 7:
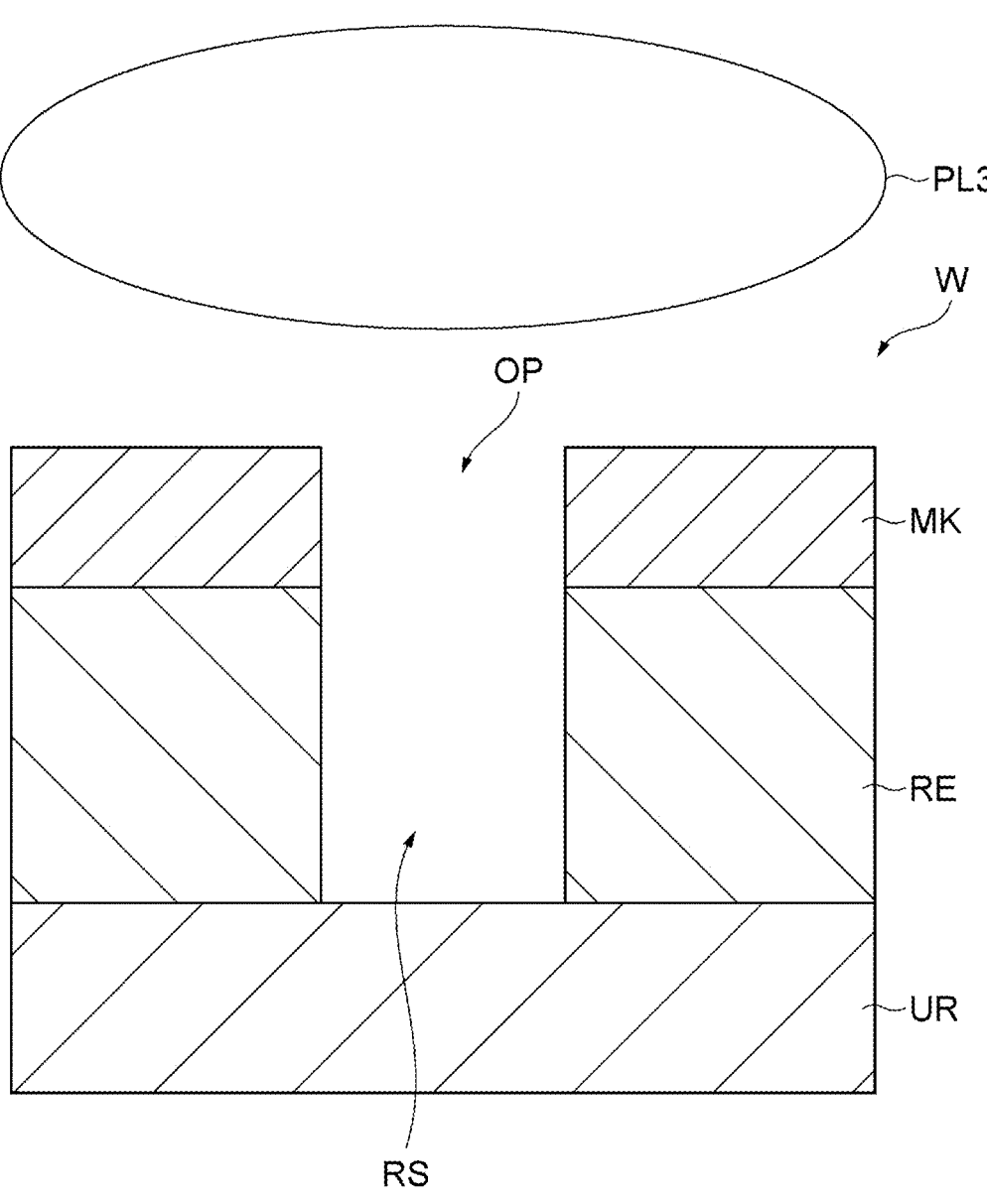
FIG. 7 is a cross-sectional view illustrating a step of an etching method according to an embodiment.

Step ST4 may include a process to etch the etching target film RE with a third plasma PL3 generated from a third processing gas as illustrated in FIG. 7. The third processing gas is different from the first and second processing gases. Between steps ST3 and ST4, the supply of the second processing gas may be stopped, and the supply of the third processing gas may be started.

Step ST4 may be performed as follows. First, the gas supply unit 20 supplies the third processing gas into the plasma processing chamber 10. Next, the plasma generation unit 12 generates the third plasma PL3 from the third processing gas in the plasma processing chamber 10. The control unit 2 controls the gas supply unit 20 and the plasma generation unit 12 to etch the etching target film RE with the third plasma PL3.

Figure 8:
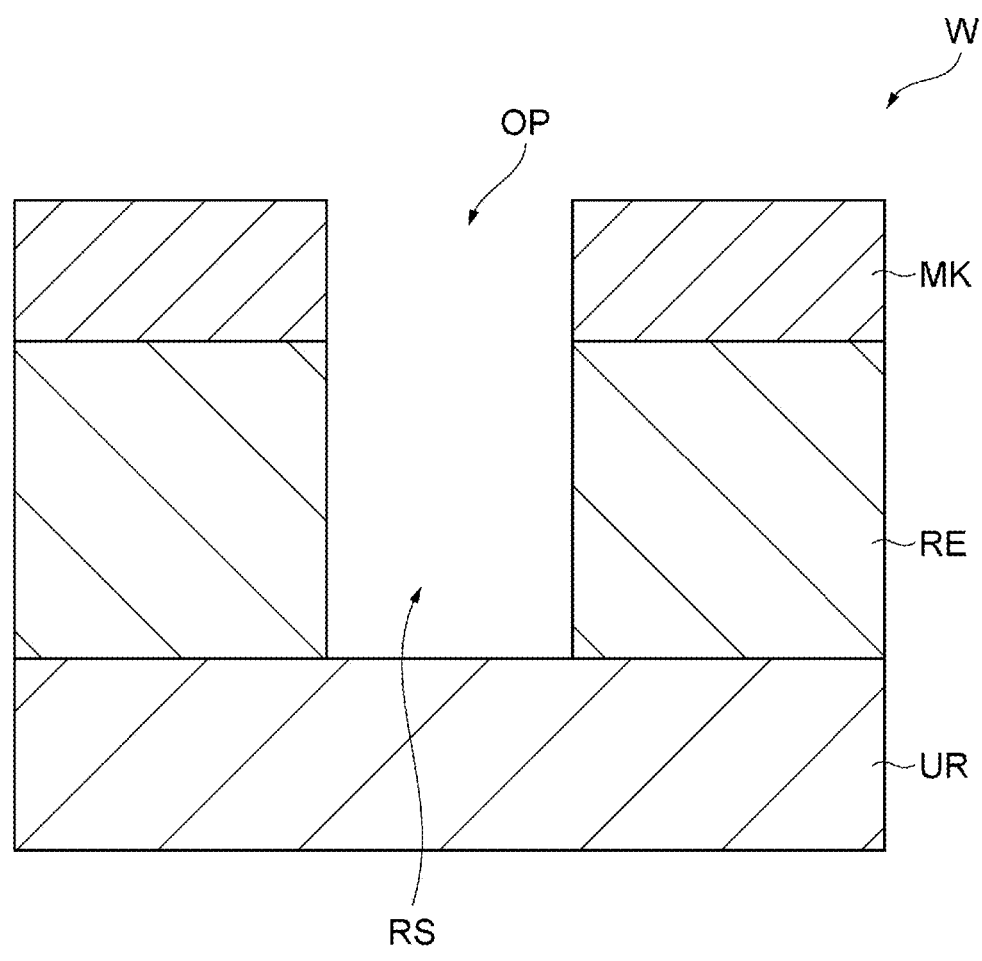
FIG. 8 is a cross-sectional view illustrating a step of an etching method according to an embodiment.

Step ST4 may include a process to etch the etching target film RE by at least one of a chemical etching that uses a gas without using plasma, and a wet etching as illustrated in FIG. 8. In this case, step ST4 may be performed as follows. First, the substrate W is taken out from the plasma processing chamber 10. Next, the substrate W is provided into a wet etching apparatus. In the wet etching apparatus, the etching target film RE is etched by an etchant.

Step ST4 may be performed in the same plasma processing chamber 10 as the plasma processing chamber 10 of step ST2 or in a different plasma processing chamber from the plasma processing chamber 10 of step ST2. Step ST4 may be performed in the same plasma processing chamber as the plasma processing chamber of step ST3 or in a different plasma processing chamber from the plasma processing chamber of step ST3. For example, a CCP chamber may be used in step ST2, an ICP chamber may be used in step ST3, and a CCP or ICP chamber may be used in step ST4. A transfer module may be provided between two or more chambers, and the transfer module may be equipped with a transfer chamber configured to have the depressurizable internal space. By using the transfer module, the substrate W may be transferred between chambers without breaking the vacuum environment.

(Step ST5)

In step ST5, steps ST2 to ST4 are repeated until a termination condition is satisfied. For example, step ST5 may be terminated when the number of times of performing one cycle including steps ST2 to ST4 reaches a threshold value.

According to the plasma processing apparatus 1 and the method MT1 described above, the metal-containing deposit DP2 (see, e.g., FIG. 6) having a desired shape or desired characteristics may be formed on the mask MK. As a result, the shape of the recess RS formed in step ST4 may be controlled.

Figure 9:
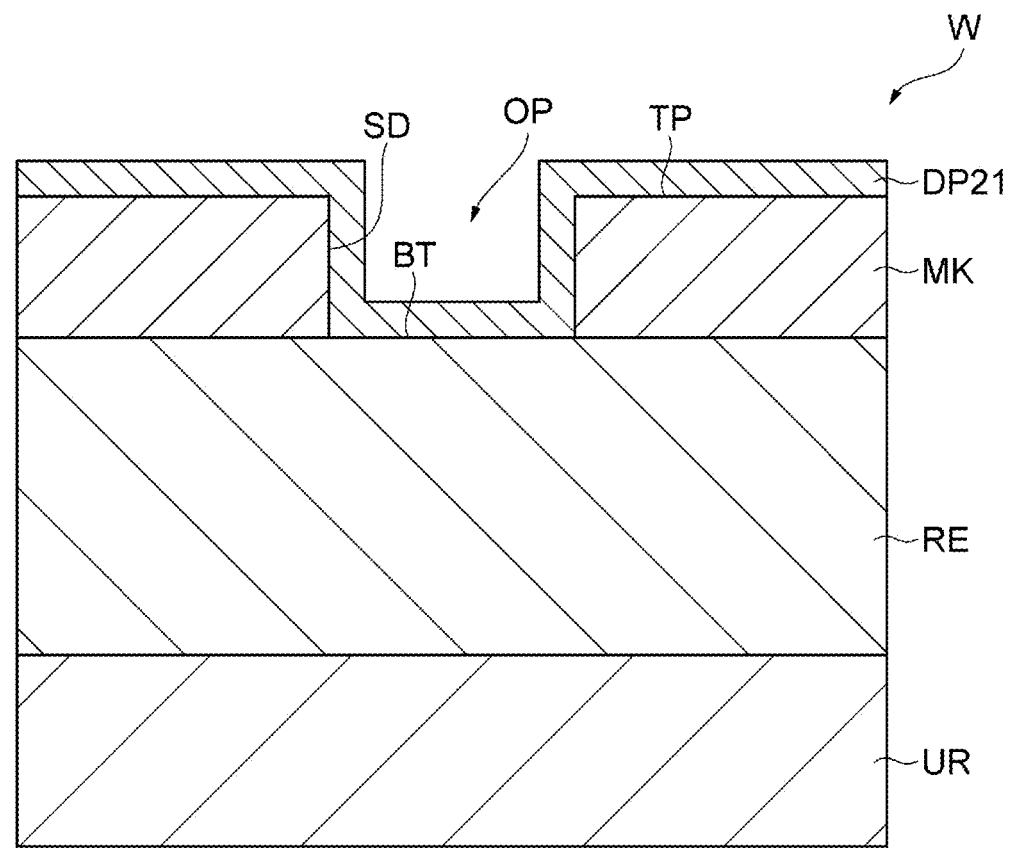
FIG. 9 is a cross-sectional view of an example of a substrate including a metal-containing deposit deformed by a second plasma under a first condition.

FIG. 9 is a cross-sectional view of an example of the substrate including the metal-containing deposit deformed by the second plasma under a first condition. In the first condition, a bias power is supplied to the substrate support 11 during step ST3. The second processing gas includes at least one of $C_4F_6$ gas, $CH_3F$ gas, and $CHF_3$ gas.

As illustrated in FIG. 9, in the first condition, a metal-containing deposit DP21 is obtained as an example of the metal-containing deposit DP2 of FIG. 6. In the first condition, the metal-containing deposit tends to be deposited on the side wall SD of the opening OP of the mask MK. Before step ST3, the thickness of the metal-containing deposit DP1 on the top surface TP of the mask MK is larger than the thickness of the metal-containing deposit DP1 on the side wall SD of the opening OP of the mask MK. Accordingly, after step ST3, the metal-containing deposit DP21, which is a nearly conformal film, is obtained. The metal-containing deposit DP21 may have substantially the same thickness on the top surface TP of the mask MK and the side wall SD of the opening OP.

The mechanism for obtaining the metal-containing deposit DP21 having the shape described above is presumed as follows, but is not limited thereto. In step ST3, the metal-containing deposit DP1 on the top surface TP of the mask MK is sputtered by the bias power. Then, particles resulting from the sputtering are reattached to the side wall SD of the opening OP of the mask MK. Thus, the metal-containing deposit DP1 on the top surface TP of the mask MK becomes thinner, and the metal-containing deposit DP1 on the side wall SD of the opening OP of the mask MK becomes thicker. As a result, the metal-containing deposit DP21 having the shape described above is obtained.

Figure 10:
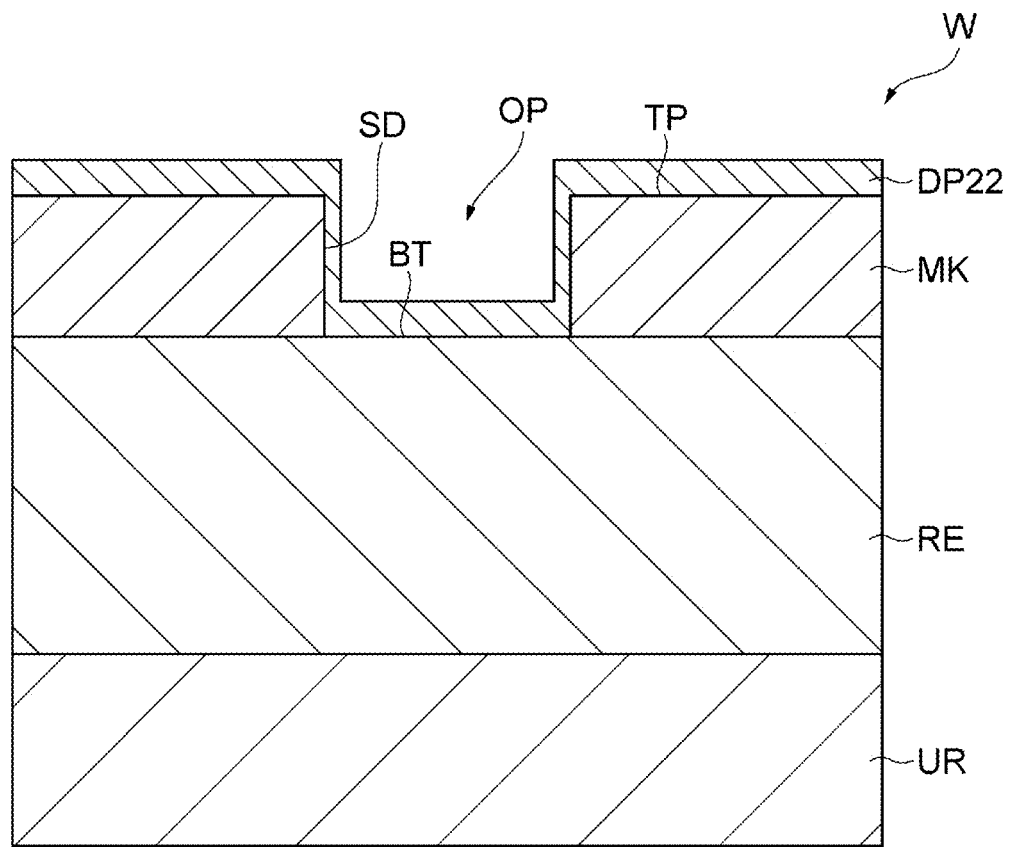
FIG. 10 is a cross-sectional view of an example of a substrate including a metal-containing deposit deformed by a second plasma under a second condition.

FIG. 10 is a cross-sectional view of an example of the substrate including the metal-containing deposit deformed by the second plasma under a second condition. In the second condition, no bias power is supplied to the substrate support 11 during step ST3. The second processing gas includes at least one of $C_4F_6$ gas, $CH_3F$ gas, and $CHF_3$ gas.

As illustrated in FIG. 10, in the second condition, a metal-containing deposit DP22 is obtained as an example of the metal-containing deposit DP2 of FIG. 6. In the second condition, the metal-containing deposit on the side wall SD of the opening OP of the mask MK tends to be neither etched nor increase. Before step ST3, the thickness of the metal-containing deposit DP1 on the top surface TP of the mask MK is larger than the thickness of the metal-containing deposit DP1 on the side wall SD of the opening OP of the mask MK. Thus, after step ST3, the metal-containing deposit DP22 has a first thickness on the top surface TP of the mask MK and a second thickness, which is smaller than the first thickness, on the side wall SD of the opening OP of the mask MK.

The mechanism for obtaining the metal-containing deposit DP22 having the shape described above is presumed as follows, but is not limited thereto. In step ST3, since no bias power is supplied to the substrate support 11, the metal-containing deposit DP1 on the top surface TP of the mask MK is hardly sputtered. As a result, the metal-containing deposit DP22 having the shape described above is obtained.

Figure 11:
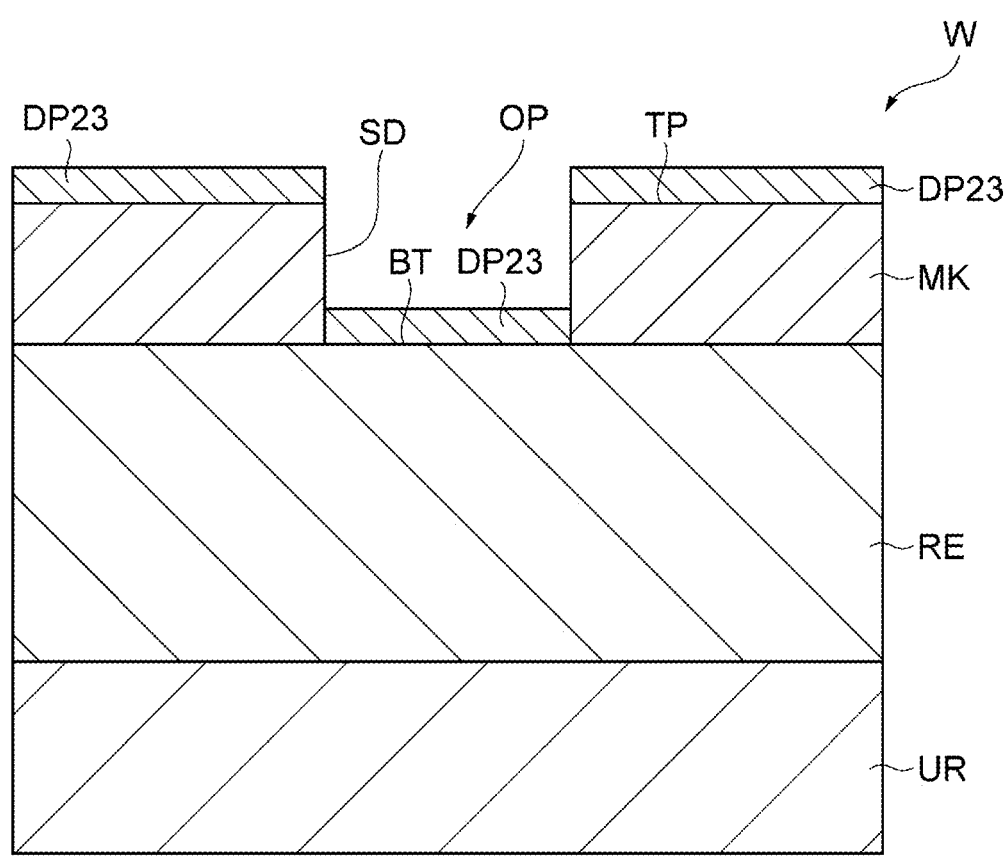
FIG. 11 is a cross-sectional view of an example of a substrate including a metal-containing deposit deformed by a second plasma under a third condition.

FIG. 11 is a cross-sectional view of an example of the substrate including the metal-containing deposit deformed by the second plasma under a third condition. In the third condition, the second processing gas includes a halogen-containing gas that contains silicon.

As illustrated in FIG. 11, in the third condition, a metal-containing deposit DP23 is obtained as an example of the metal-containing deposit DP2 of FIG. 6. In the third condition, the metal-containing deposit on the side wall SD of the opening OP of the mask MK tends to be etched. Meanwhile, the metal-containing deposit DP1 on the top surface TP of the mask MK and the bottom BT of the opening OP is hardly etched. Therefore, after step ST3, the metal-containing deposit DP23 has no thickness on the side wall SD of the opening OP of the mask MK.

The mechanism for obtaining the metal-containing deposit DP23 having the shape described above is presumed as follows, but is not limited thereto. In step ST3, active species containing silicon and halogen react with the metal-containing deposit DP1 on the side wall SD of the opening OP of the mask MK. For example, the composition ratio of fluorine in the metal-containing deposit DP1 on the side wall SD is larger than the composition ratio of fluorine in the metal-containing deposit DP1 on the top surface TP of the mask MK. In this case, radicals containing silicon and chlorine react with fluorine, so that the metal-containing deposit DP1 on the side wall SD is selectively etched.

Figure 12:
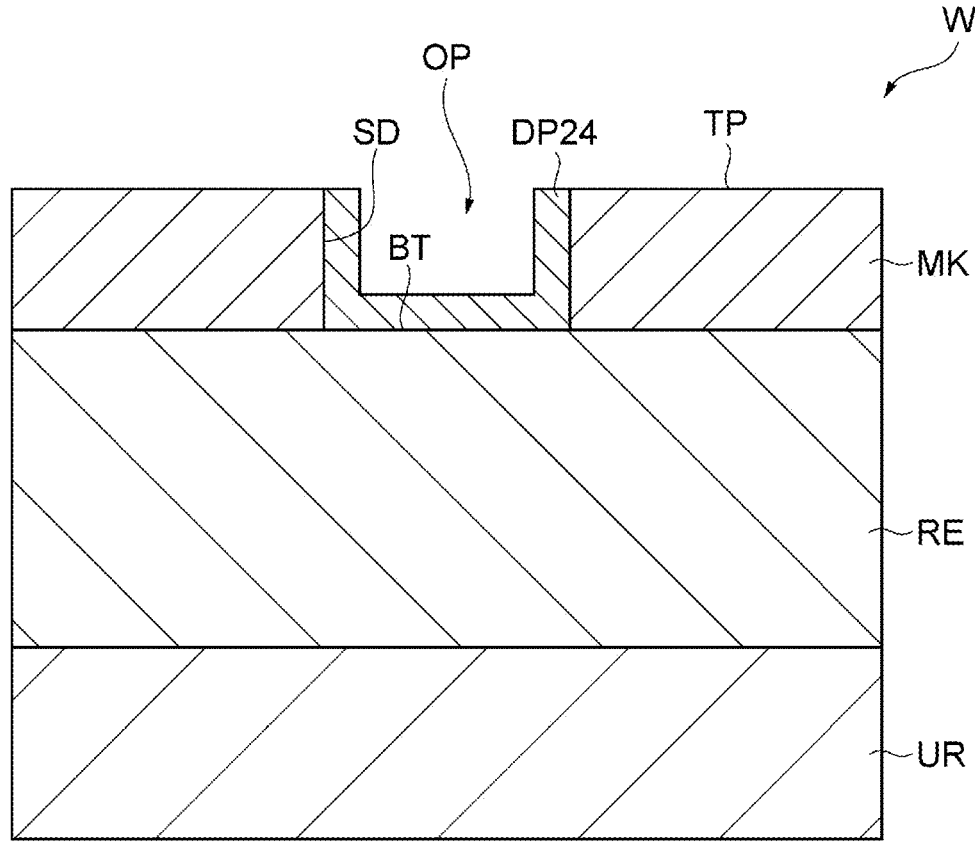
FIG. 12 is a cross-sectional view of an example of a substrate including a metal-containing deposit deformed by a second plasma under a fourth condition.

FIG. 12 is a cross-sectional view of an example of the substrate including the metal-containing deposit deformed by the second plasma under a fourth condition. In the fourth condition, the second processing gas includes $NF_3$ gas.

As illustrated in FIG. 12, in the fourth condition, a metal-containing deposit DP24 is obtained as an example of the metal-containing deposit DP2 of FIG. 6. In the fourth condition, the metal-containing deposit DP24 tends to be hardly formed on the top surface TP of the mask MK.

The mechanism for obtaining the metal-containing deposit DP24 having the shape described above is presumed as follows, but is not limited thereto. In step ST3, the metal-containing deposit DP1 on the top surface TP of the mask MK is etched. In the fourth condition, since the content of carbon contained in the second processing gas is small, a carbon-containing deposit is hardly formed on the top surface TP of the mask MK. Therefore, the etching amount of the metal-containing deposit DP1 on the top surface TP of the mask MK increases. Meanwhile, the metal-containing deposit DP1 on the side wall SD and the bottom BT of the opening OP of the mask MK is hardly etched. As a result, the metal-containing deposit DP24 having the shape described above is obtained.

In step ST3, two or more of the first to fourth conditions illustrated in FIGS. 9 to 12 may be combined. As a result, the degree of freedom in controlling the shape of the metal-containing deposit is improved.

While various embodiments have been described, various additions, omissions, substitutions, and modifications may be made without being limited to the embodiments. Further, elements in different embodiments may be combined to implement other embodiments. For example, the present disclosure also includes a method of manufacturing a semiconductor device, including the etching method described in any one of Embodiments 1 to 17.

Hereinafter, descriptions will be made on various experiments conducted to evaluate the method MT1. The experiments are not intended to limit the present disclosure.

(First Experiment)

In a first experiment, a substrate including a silicon film and a mask on the silicon film was prepared. The mask was a silicon oxide film having an opening. Next, the substrate was provided into the plasma processing chamber of the plasma processing apparatus Next, a tungsten-containing deposit was formed on the mask by the first plasma generated from the first processing gas including $WF_6$ gas, Ar gas, and $H_2$ gas. The tungsten-containing deposit was formed on the top surface of the mask, and the side wall and the bottom of the opening of the mask.

Next, the substrate was exposed to the second plasma generated from the second processing gas including $C_4F_6$ gas, Ar gas, and $O_2$ gas for 60 or 120 seconds. A capacitively coupled plasma processing apparatus was used as the plasma processing apparatus. A bias power was applied to the substrate support. In this way, the tungsten-containing deposit was deformed.

Result of First Experiment

Figure 13:
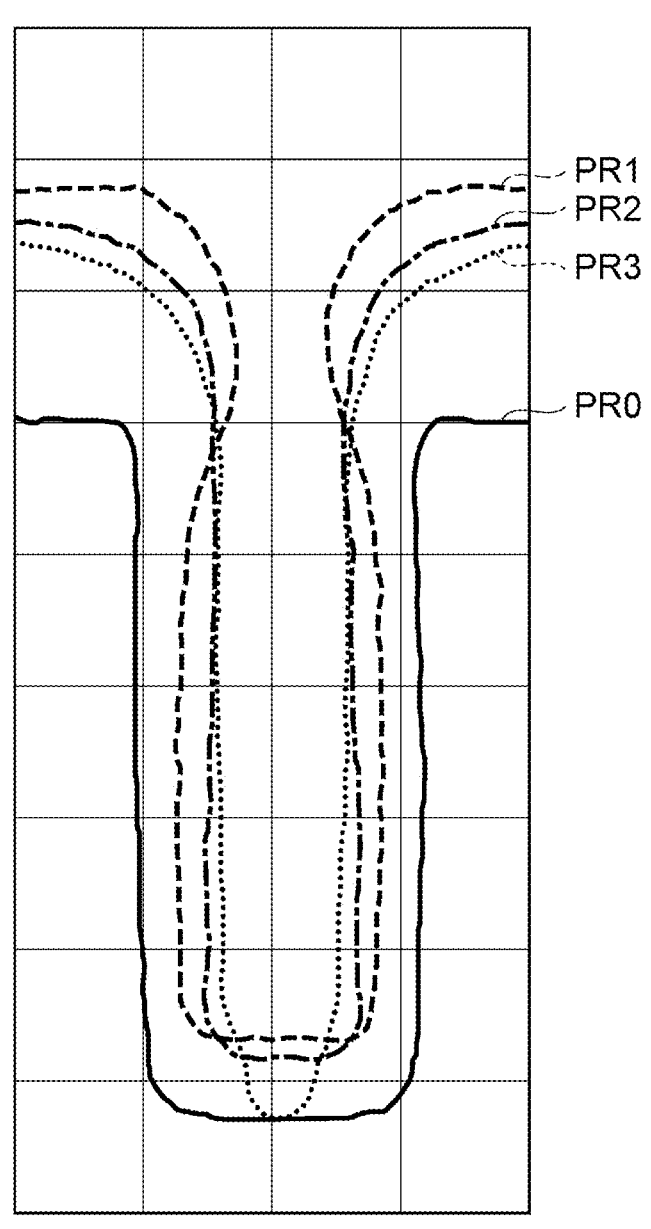
FIG. 13 is a view illustrating an example of a surface profile of a tungsten-containing deposit in a first experiment.

FIG. 13 is a view illustrating an example of the surface profile of the tungsten-containing deposit in the first experiment. The profile PR0 represents the surface profile of the mask in the cross section of the substrate. The profile PR0 represents the top surface of the mask, and the side wall and the bottom of the opening of the mask. The profiles PR1 to PR3 each represent the surface profile of the tungsten-containing deposit in the cross section of the substrate. The profile PR1 represents the surface of the tungsten-containing deposit formed by the first plasma. The profile PR2 represents the surface of the tungsten-containing deposit deformed after the substrate is exposed to the second plasma for 60 seconds. The profile PR3 represents the surface of the tungsten-containing deposit deformed after the substrate is exposed to the second plasma for 120 seconds.

As illustrated in FIG. 13, in the profiles PR2 and PR3, the thickness of the tungsten-containing deposit on the side wall of the opening of the mask is larger than the profile PR1. In the profiles PR2 and PR3, the thickness of the tungsten-containing deposit on the top surface of the mask is smaller than the profile PR1. The profile PR2 represents that the tungsten-containing deposit is a nearly conformal film. In the profile PR3, the thickness of the tungsten-containing deposit is zero at the bottom of the opening of the mask.

From FIG. 13, it may be identified that by exposing the substrate to the second plasma in the first experiment, it is possible to etch the tungsten-containing deposit on the top surface of the mask and the bottom of the opening of the mask, while forming the tungsten-containing deposit on the side wall of the opening of the mask.

Figure 14:
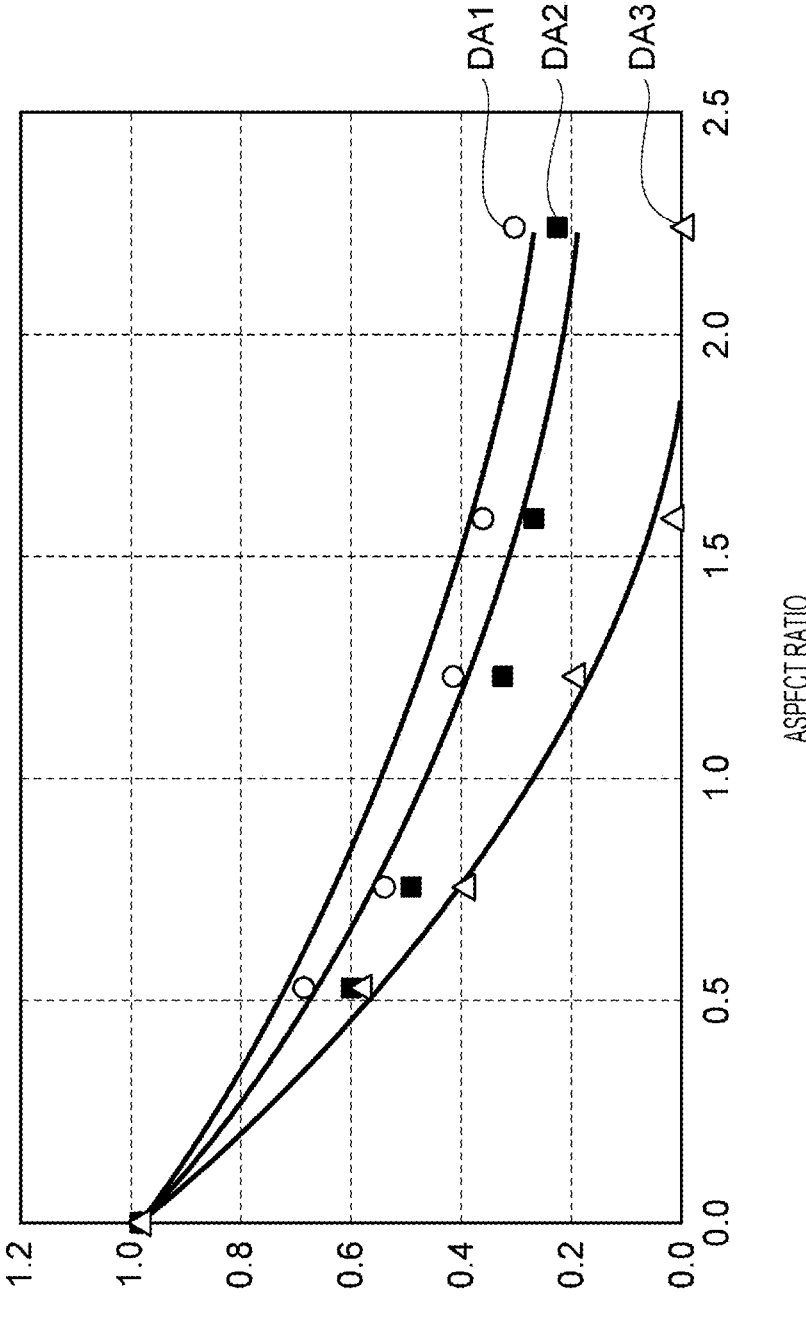
FIG. 14 is a graph illustrating an example of a relationship between a thickness and an aspect ratio of the tungsten-containing deposit in the first experiment.

FIG. 14 is a graph illustrating an example of the relationship between the thickness of the tungsten-containing deposit and the aspect ratio in the first experiment. In the graph, the vertical axis represents the normalized thickness (nm) of the tungsten-containing deposit on the bottom of the opening of the mask. The normalized thickness refers to the ratio between the thickness of the tungsten-containing deposit on the bottom of the opening of the mask and the thickness of the tungsten-containing deposit on the top surface of the mask. In the graph, the horizontal axis represents the aspect ratio of the opening of the mask. The plot DA1 represents the thickness calculated in the profile PR1 of FIG. 13. The plot DA2 represents the thickness calculated in the profile PR2 of FIG. 13. The plot DA3 represents the thickness calculated in the profile PR3 of FIG. 13.

From FIG. 14, it may be identified that the normalized thickness of the tungsten-containing deposit on the bottom of the opening of the mask decreases as the time for exposing the substrate to the second plasma in the first experiment increases. Further, it may be identified that the normalized thickness of the tungsten-containing deposit on the bottom of the opening of the mask decreases as the aspect ratio increases. This is considered to be because when the aspect ratio of the mask is high, the active species in the first plasma is difficult to reach the bottom of the opening of the mask during the formation of the tungsten-containing deposit by the first plasma.

Second Experiment

A second experiment was conducted in the same manner as the first experiment, except for the step of deforming the tungsten-containing deposit. In the second experiment, the substrate was exposed for 30 seconds or 60 seconds to the second plasma generated from the second processing gas including $CH_3F$ gas, $CHF_3$ gas, $NF_3$ gas, $N_2$ gas, and Ar gas. An inductively coupled plasma processing apparatus was used as the plasma processing apparatus. No bias power was applied to the substrate support. In this way, the tungsten-containing deposit was deformed.

Result of Second Experiment

Figure 15:
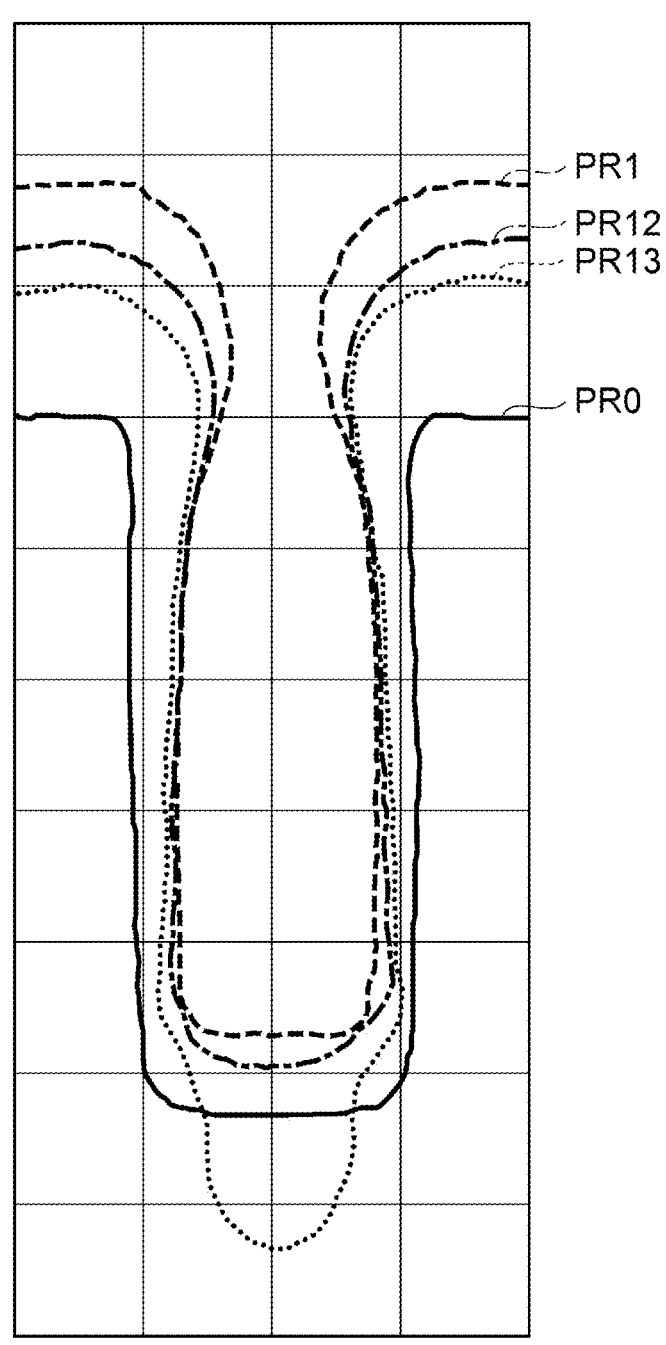
FIG. 15 is a view illustrating an example of a surface profile of a tungsten-containing deposit in a second experiment.

FIG. 15 is a view illustrating an example of the surface profile of the tungsten-containing deposit in the second experiment. The profiles PR0 and PR1 are the same as the profiles PR0 and PR1 of FIG. 13. The profile PR12 represents the surface of the tungsten-containing deposit deformed after the substrate is exposed to the second plasma for 30 seconds, in the cross section of the substrate. The profile PR13 represents the surface of the tungsten-containing deposit deformed after the substrate is exposed to the second plasma for 60 seconds, in the cross section of the substrate.

As illustrated in FIG. 15, in the profiles PR12 and PR13, the thickness of the tungsten-containing deposit on the top surface of the mask and the bottom of the opening of the mask becomes smaller than the profile PR1. Meanwhile, in the profiles PR1, PR12, and PR13, the thickness of the tungsten-containing deposit on the side wall of the opening of the mask hardly changes.

From FIG. 15, it may be identified that by exposing the substrate to the second plasma in the second experiment, it is possible to etch the tungsten-containing deposit on the top surface of the mask and the bottom of the opening of the mask while suppressing the etching of the tungsten-containing deposit on the side wall of the opening of the mask.

Figure 16:
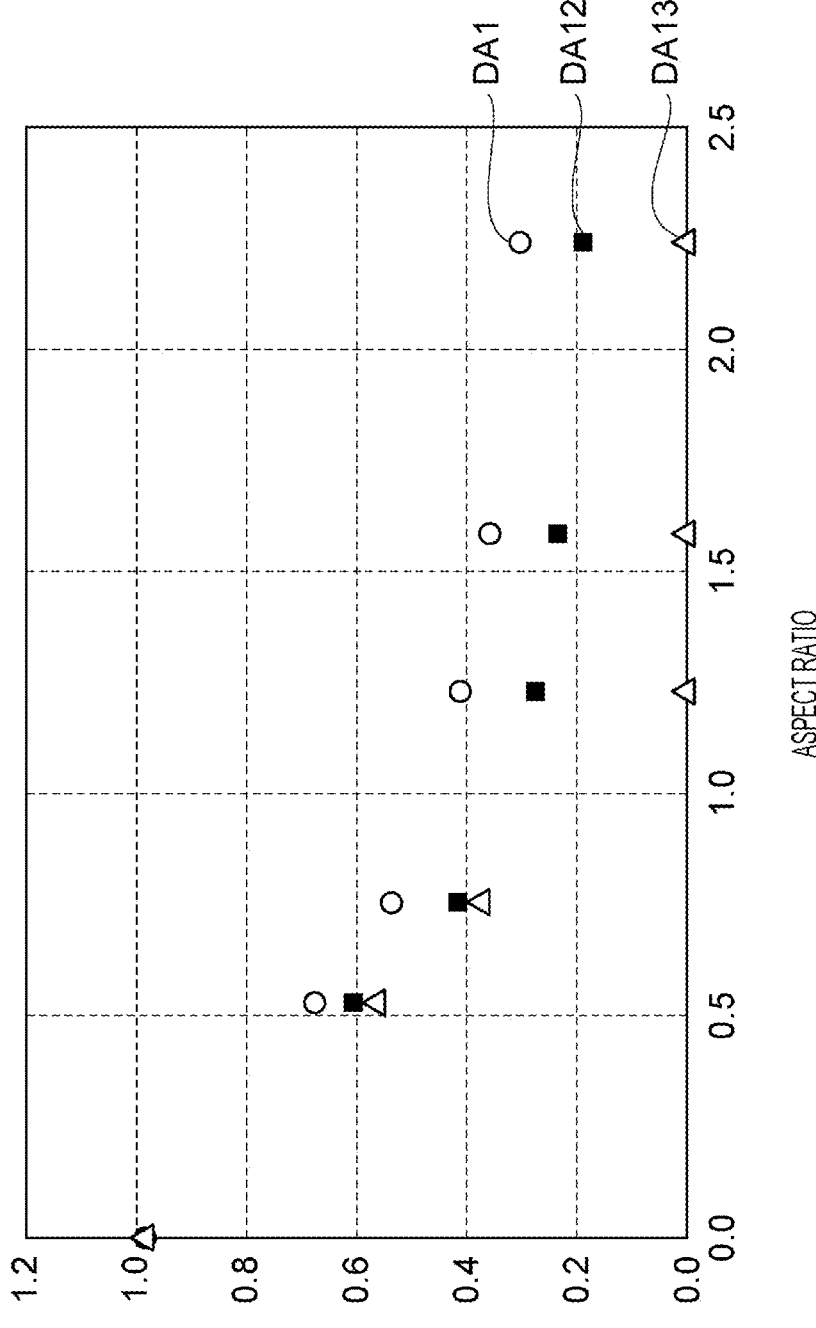
FIG. 16 is a graph illustrating an example of a relationship between a thickness and an aspect ratio of the tungsten-containing deposit in the second experiment.

FIG. 16 is a graph illustrating an example of the relationship between the thickness and the aspect ratio of the tungsten-containing deposit in the second experiment. The vertical and horizontal axes of the graph are the same as those of the graph of FIG. 14. The plot DA1 represents the thickness calculated in the profile PR1 of FIG. 15. The plot DA12 represents the thickness calculated in the profile PR12 of FIG. 15. The plot DA13 represents the thickness calculated in the profile PR13 of FIG. 15.

From FIG. 16, it may be identified that the normalized thickness of the tungsten-containing deposit on the bottom of the opening of the mask decreases as the time for exposing the substrate to the second plasma in the second experiment is increased. Further, it may also be identified that the normalized thickness of the tungsten-containing deposit on the bottom of the opening of the mask decreases as the aspect ratio increases. This is considered to be because when the aspect ratio of the mask is high, the active species in the first plasma is difficult to reach the bottom of the opening of the mask during the formation of the tungsten-containing deposit by the first plasma.

Third Experiment

A third experiment was conducted in the same manner as the first experiment, except for the process of deforming the tungsten-containing deposit. In the third experiment, the substrate was exposed for 60 seconds to the second plasma generated from the second processing gas including $SiCl_4$ gas, $Cl_2$ gas, and Ar gas. An inductively coupled plasma processing apparatus was used as the plasma processing apparatus. No bias power was applied to the substrate support. In this way, the tungsten-containing deposit was deformed.

Result of Third Experiment

Figure 17:
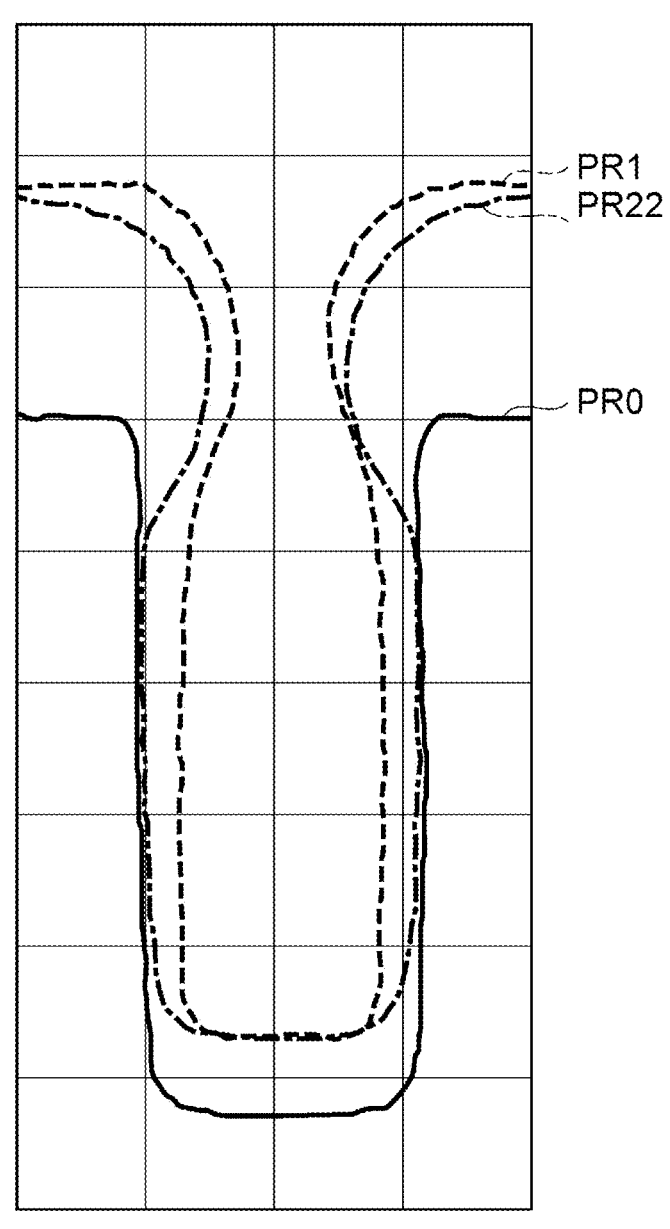
FIG. 17 is a view illustrating an example of a surface profile of a tungsten-containing deposit in a third experiment.

FIG. 17 is a view illustrating an example of the surface profile of the tungsten-containing deposit in the third experiment. The profiles PR0 and PR1 are the same as the profiles PR0 and PR1 of FIG. 13. The profile PR22 represents the surface of the deformed tungsten-containing deposit, in the cross section of the substrate.

As illustrated in FIG. 17, in the profile PR22, the thickness of the tungsten-containing deposit on the side wall of the opening of the mask is smaller than the profile PR1. Meanwhile, in the profiles PR1 and PR22, the thickness of the tungsten-containing deposit on the top surface of the mask and the bottom of the opening of the mask hardly changes.

From FIG. 17, it may be identified that by exposing the substrate to the second plasma in the third experiment, it is possible to etch the tungsten-containing deposit on the side wall of the opening of the mask while suppressing the etching of the tungsten-containing deposit on the top surface of the mask and the bottom of the opening of the mask.

Figure 18:
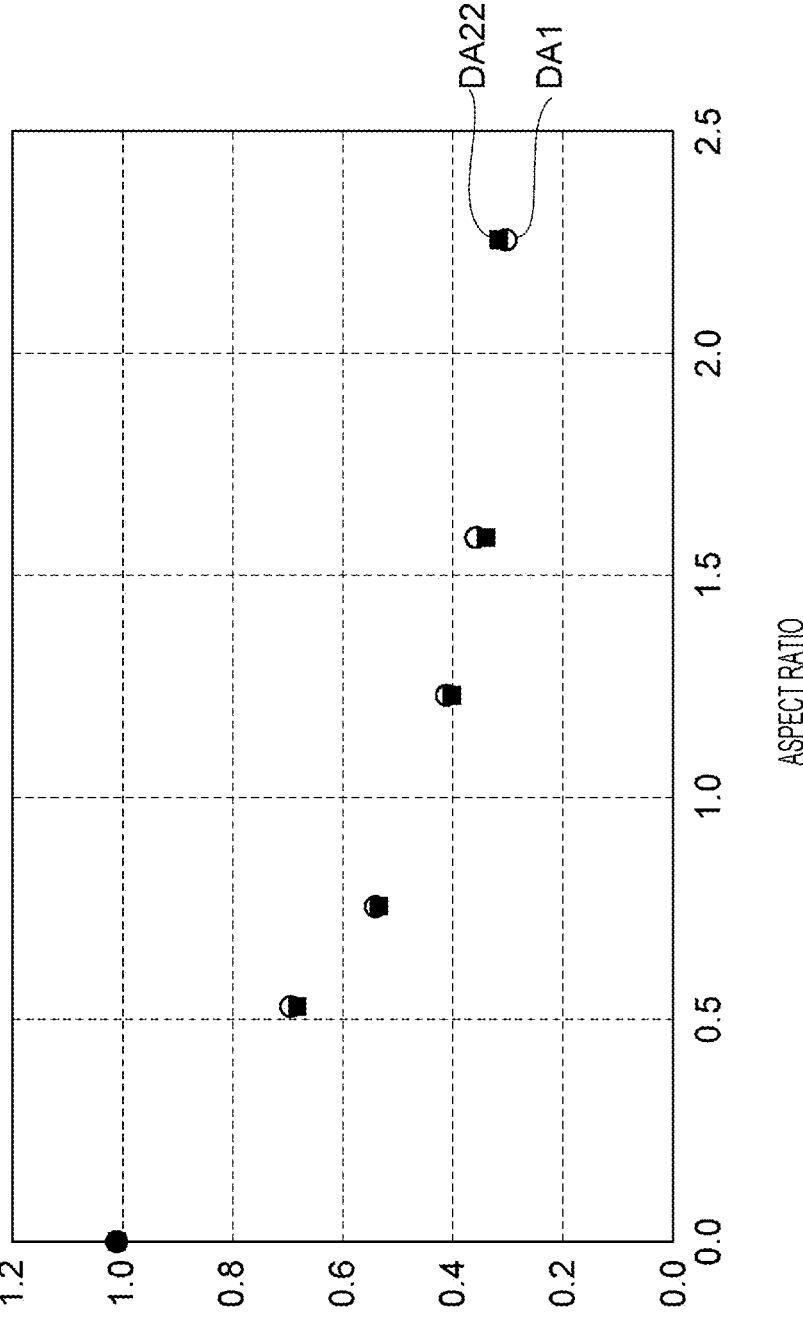
FIG. 18 is a graph illustrating an example of a relationship between a thickness and an aspect ratio of the tungsten-containing deposit in the third experiment.

FIG. 18 is a graph illustrating an example of the relationship between the thickness of the tungsten-containing deposit and the aspect ratio in the third experiment. The vertical and horizontal axes of the graph are the same as those of the graph in FIG. 14. The plot DA1 represents the thickness calculated in the profile PR1 of FIG. 17. The plot DA22 represents the thickness calculated in the profile PR22 of FIG. 17.

From FIG. 18, it may be identified that the normalized thickness of the tungsten-containing deposit on the bottom of the opening of the mask hardly changes even though the substrate is exposed to the second plasma in the third experiment. Further, it may be identified that the normalized thickness of the tungsten-containing deposit on the bottom of the opening of the mask decreases as the aspect ratio increases. This is considered to be because when the aspect ratio of the mask is high, the active species in the first plasma is difficult to reach the bottom of the opening of the mask during the formation of the tungsten-containing deposit by the first plasma.

Fourth Experiment

A fourth experiment was conducted in the same manner as the first experiment, except for the step of deforming the tungsten-containing deposit. In the fourth experiment, the substrate was exposed for 60 seconds to the second plasma generated from the second processing gas including $Cl_2$ gas, $NF_3$ gas, Ar gas, and $O_2$ gas. An inductively coupled plasma processing apparatus was used as the plasma processing apparatus. No bias power was applied to the substrate support. In this way, the tungsten-containing deposit was deformed.

Result of Fourth Experiment

Figure 19:
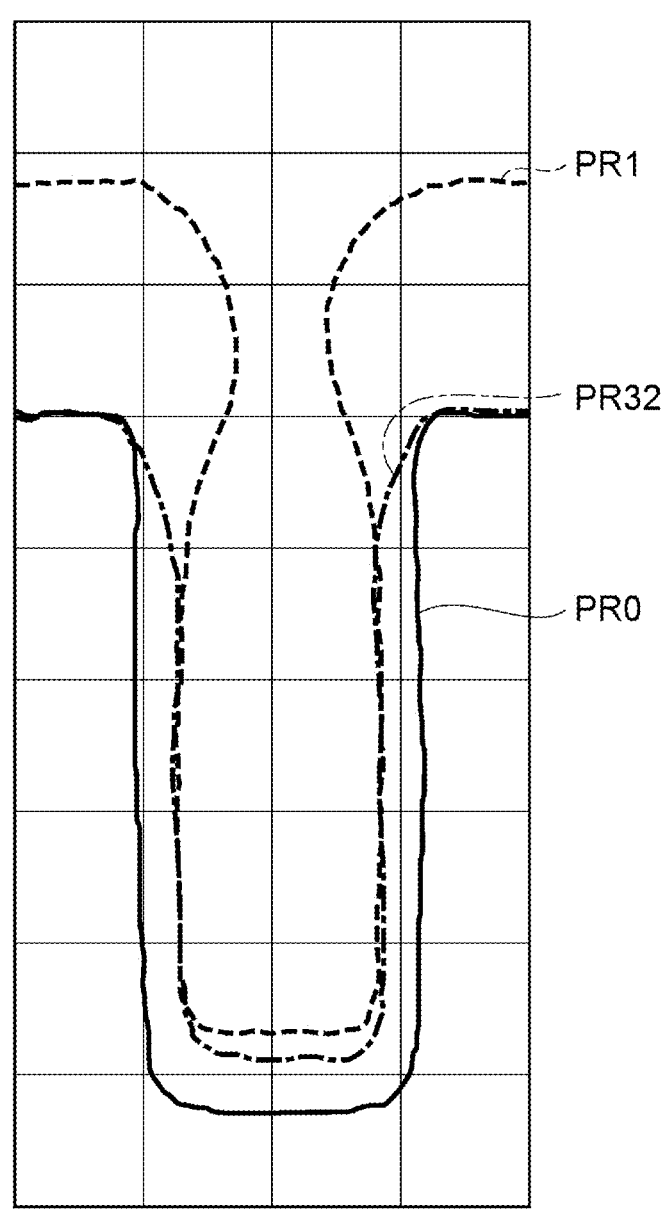
FIG. 19 is a view illustrating an example of a surface profile of a tungsten-containing deposit in a fourth experiment.

FIG. 19 is a view illustrating an example of the surface profile of the tungsten-containing deposit in the fourth experiment. The profiles PR0 and PR1 are the same as the profiles PR0 and PR1 of FIG. 13. The profile PR32 represents the surface of the deformed tungsten-containing deposit, in the cross section of the substrate.

As illustrated in FIG. 19, in the profile PR32, the thickness of the tungsten-containing deposit on the top surface of the mask is smaller than the profile PR1. Meanwhile, in the profiles PR1 and PR32, the thickness of the tungsten-containing deposit on the side wall and bottom of the opening of the mask hardly changes.

From FIG. 19, it may be identified that by exposing the substrate to the second plasma in the fourth experiment, it is possible to etch the tungsten-containing deposit on the top surface of the mask while suppressing the etching of the tungsten-containing deposit on the side wall and the bottom of the opening of the mask.

Fifth Experiment

A fifth experiment was conducted in the same manner as the first experiment, except for the step of deforming the tungsten-containing deposit. In the fifth experiment, both the step of deforming the tungsten-containing deposit in the third experiment and the step of deforming the tungsten-containing deposit in the second experiment were performed. That is, the substrate was exposed to the second plasma generated from the second processing gas including $SiCl_4$ gas, $Cl_2$ gas, and Ar gas. Then, the substrate was exposed to the second plasma generated from the second processing gas including $CH_3F$ gas, $CHF_3$ gas, $NF_3$ gas, $N_2$ gas, and Ar gas. An inductively coupled plasma processing apparatus was used as the plasma processing apparatus. No bias power was applied to the substrate support. In this way, the tungsten-containing deposit was deformed.

Result of Fifth Experiment

Figure 20:
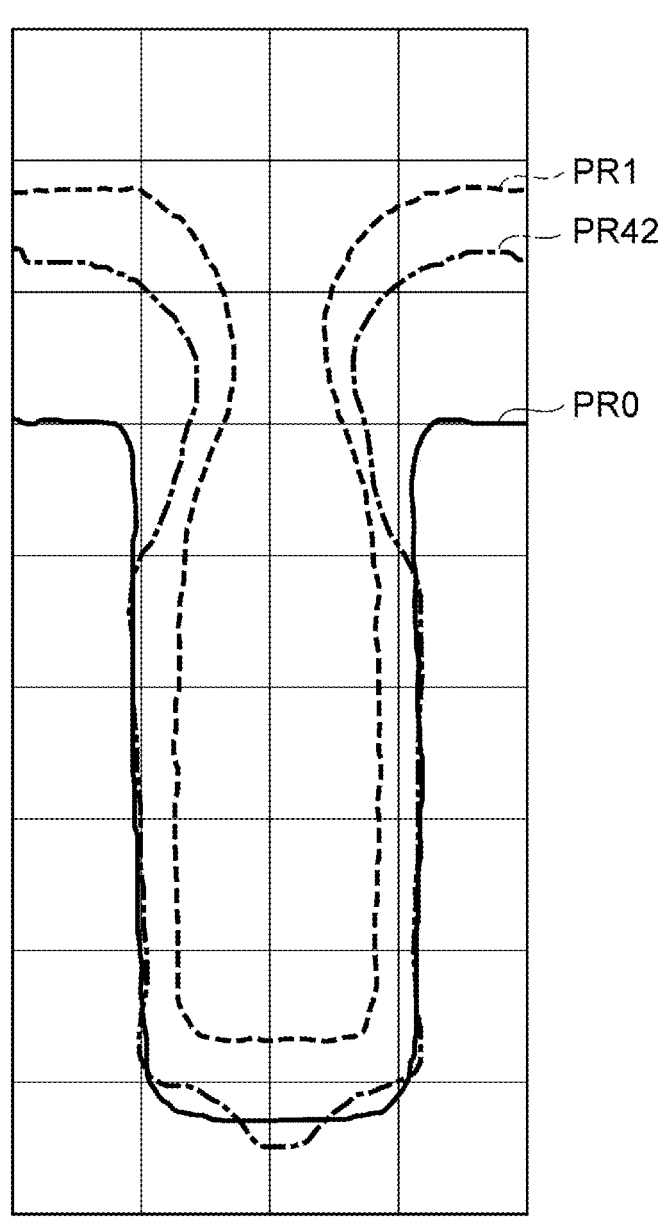
FIG. 20 is a graph illustrating an example of a surface profile of a tungsten-containing deposit in a fifth experiment.

FIG. 20 is a view illustrating an example of the surface profile of the tungsten-containing deposit in the fifth experiment. The profiles PR0 and PR1 are the same as the profiles PR0 and PR1 of FIG. 13. The profile PR42 represents the surface of the deformed tungsten-containing deposit, in the cross section of the substrate.

As illustrated in FIG. 20, in the profile PR42, the thickness of the tungsten-containing deposit on the side wall and the bottom of the opening of the mask is smaller than the profile PR1. In the profile PR42, the thickness of the tungsten-containing deposit on the top surface of the mask is not significantly reduced.

From FIG. 20, it may be identified that by exposing the substrate to the second plasma in the fifth experiment, it is possible to etch the tungsten-containing deposit on the side wall and the bottom of the opening of the mask while suppressing the etching of the tungsten-containing deposit on the top surface of the mask.

According to an embodiment, an etching method and a plasma processing apparatus are provided, which are capable of forming a metal-containing deposit having a desired shape or desired characteristics on a mask.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   (a) providing a substrate including an etching target film and a mask on the etching target film;

(b) after (a), forming a metal-containing deposit on the mask by a first plasma generated from a first processing gas including a metal-containing gas and a hydrogen-containing gas, the metal-containing gas including at least one of tungsten, molybdenum and zirconium;

(c) after (b), deforming or modifying the metal-containing deposit by a second plasma generated from a second processing gas different from the first processing gas; and (d) after (c), etching the etching target film.

2. The etching method according to claim 1, wherein (d) includes etching the etching target film by a third plasma generated from a third processing gas different from the first and second processing gases.

3. The etching method according to claim 1, wherein the hydrogen-containing gas includes at least one of hydrogen gas, hydrocarbon gas, and hydrofluorocarbon gas.

4. The etching method according to claim 1, wherein the first processing gas includes a noble gas.

5. The etching method according to claim 1, wherein in (b), a temperature of a substrate support that supports the substrate is 0° C. or higher and 250° C. or lower.

6. The etching method according to claim 1, wherein a flow rate ratio of the hydrogen-containing gas over the metal-containing gas is 2 or more and 40 or less.

7. The etching method according to claim 1, wherein the second processing gas includes at least one of fluorocarbon gas, hydrofluorocarbon gas, and a halogen-containing gas.

8. The etching method according to claim 7, wherein the second processing gas includes at least one of $C_4F_6$ gas, $CH_3F$ gas, and $CHF_3$ gas.

9. The etching method according to claim 7, wherein second processing gas includes a halogen-containing gas that contains silicon.

10. The etching method according to claim 7, wherein the second processing gas includes $NF_3$ gas.

11. The etching method according to claim 1, wherein in (c), a bias power is supplied to a substrate support that supports the substrate.

12. The etching method according to claim 1, wherein the mask includes at least one of a silicon-containing film, a carbon-containing film, and a metal-containing film.

13. The etching method according to claim 1, wherein an opening is formed in the mask, and an aspect ratio of the opening is 1 or more and 100 or less.

14. The etching method according to claim 1, wherein the etching target film includes at least one of a silicon-containing film and a carbon-containing film.

15. The etching method according to claim 14, wherein the etching target film includes at least one of a silicon-containing film that contains boron, a silicon film, a silicon oxide film, and a silicon nitride film.

16. The etching method according to claim 1, wherein (d) includes etching the etching target film by at least one of chemical etching that uses a gas without using a plasma, and wet etching.

17. An etching method comprising:

(a) providing a substrate having an etching target film including a silicon-containing film, and a mask on the etching target film;

(b) after (a), forming a tungsten-containing deposit on the mask by a first plasma generated from a first processing gas including tungsten hexafluoride gas and a hydrogen-containing gas, the hydrogen-containing gas including at least one of hydrogen gas, hydrocarbon gas, and hydrofluorocarbon gas;

(c) after (b), deforming or modifying the tungsten-containing deposit by a second plasma generated from a second processing gas different from the first processing gas, the second processing gas including at least one of fluorocarbon gas, hydrofluorocarbon gas, and a halogen-containing gas; and (d) after (c), etching the etching target film by a third plasma generated from a third processing gas different from the first and second processing gases.

18. An etching method comprising:

(a) providing a substrate including an etching target film and a mask on the etching target film;

(b) after (a), forming a metal-containing deposit on the mask by a first plasma generated from a first processing gas including a metal-containing gas and a hydrogen-containing gas;

(c) after (b), deforming or modifying the metal-containing deposit by a second plasma generated from a second processing gas different from the first processing gas, the second processing gas including a halogen-containing gas that contains silicon; and (d) after (c), etching the etching target film.

* * * * *